US 12,227,292 B1

(12) United States Patent
Clark et al.

(10) Patent No.: US 12,227,292 B1
(45) Date of Patent: *Feb. 18, 2025

(54) SYSTEM AND APPARATUS FOR A HIGH-POWER MICROWAVE SENSOR USING AN UNMANNED AERIAL VEHICLE

(71) Applicant: BlueHalo, LLC, Huntsville, AL (US)

(72) Inventors: Alexis Henry Clark, Owens Crossroads, AL (US); Walter Mark Henderson, Elizabeth, CO (US); Marcus Thompson, Huntsville, AL (US); Levi Judah Smolin, Huntsville, AL (US)

(73) Assignee: BlueHalo, LLC, Huntsville, AL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/591,494

(22) Filed: Feb. 29, 2024

Related U.S. Application Data

(63) Continuation of application No. 17/715,743, filed on Apr. 7, 2022, now Pat. No. 11,932,396.
(Continued)

(51) Int. Cl.
*B64C 39/02* (2023.01)
*G01C 21/20* (2006.01)
(Continued)

(52) U.S. Cl.
CPC ............ *B64C 39/024* (2013.01); *G01C 21/20* (2013.01); *G05D 1/101* (2013.01); *H04B 1/0064* (2013.01); *B64U 10/13* (2023.01); *B64U 2201/20* (2023.01)

(58) Field of Classification Search
CPC ...... B64C 39/024; G01C 21/20; G05D 1/101; H04B 1/0064; B64U 10/13; B64U 2201/20; G01R 23/16; G01R 29/0871
See application file for complete search history.

(56) References Cited

U.S. PATENT DOCUMENTS

| 6,012,675 A * | 1/2000 | Cocatre-Zilgien ..... B64D 43/00 244/76 R |
| 7,644,016 B2 * | 1/2010 | Nycz ................. G06Q 10/0875 705/28 |

(Continued)

OTHER PUBLICATIONS

U.S. Appl. No. 17/715,743, filed Apr. 7, 2022, Issued as U.S. Pat. No. 11,932,396.

(Continued)

*Primary Examiner* — Medhat Badawi
(74) *Attorney, Agent, or Firm* — Amster, Rothstein & Ebenstein LLP

(57) ABSTRACT

Systems and apparatus are provided for a high-power microwave sensor using an unmanned aerial vehicle. The unmanned aerial vehicle may include a central body, at least one electric motor, and a barometric pressure feedthrough. The central body may include a first enclosure housing a plurality of low voltage components, a voltage feedthrough connector, and a second enclosure housing a plurality of high voltage components. The low voltage components may include a first signal processing system, a first radio transceiver, a flight controller, a second signal processing system, a second radio transceiver, and a navigation system. The high voltage components may include a plurality of electronic speed controllers, a power distribution module, an input power interface, and a plurality of high power filters. The components of each enclosure may be segregated such that the high voltage components do not create electromagnetic interference with the low voltage components.

19 Claims, 20 Drawing Sheets

Related U.S. Application Data

(60) Provisional application No. 63/260,095, filed on Aug. 9, 2021.

(51) Int. Cl.
    *G05D 1/00* (2006.01)
    *H04B 1/00* (2006.01)
    *B64U 10/13* (2023.01)

(56) References Cited

U.S. PATENT DOCUMENTS

| | | | | |
|---|---|---|---|---|
| 9,413,418 B2* | 8/2016 | Bottazzi | | H04B 1/707 |
| 9,485,037 B1* | 11/2016 | Weller | | H01Q 9/32 |
| 9,489,813 B1* | 11/2016 | Beigel | | G08B 13/2417 |
| 9,797,988 B2* | 10/2017 | Charvat | | H01Q 9/0428 |
| 9,915,725 B1* | 3/2018 | Charvat | | G01S 11/02 |
| 10,009,901 B2* | 6/2018 | Gerszberg | | H04W 72/0453 |
| 10,073,162 B2* | 9/2018 | Charvat | | H01Q 3/36 |
| 10,074,889 B2* | 9/2018 | Charvat | | H04B 5/77 |
| 10,094,909 B2* | 10/2018 | Charvat | | H01Q 9/0428 |
| 10,097,241 B1* | 10/2018 | Bogdan | | H04N 7/183 |
| 10,139,484 B2* | 11/2018 | Yoon | | G01S 13/74 |
| 10,205,218 B2* | 2/2019 | Charvat | | H01Q 9/0428 |
| 10,242,273 B1* | 3/2019 | Eckman | | G06V 20/54 |
| 10,386,456 B1* | 8/2019 | Zai | | G01S 5/14 |
| 10,422,870 B2* | 9/2019 | Mindell | | G01B 11/14 |
| 10,495,421 B2* | 12/2019 | Abramov | | F41H 11/02 |
| 10,505,256 B2* | 12/2019 | Charvat | | G01S 13/878 |
| 10,591,592 B2* | 3/2020 | Mindell | | G01S 5/10 |
| 10,665,923 B2* | 5/2020 | Charvat | | H01Q 1/2216 |
| 10,712,738 B2* | 7/2020 | Cella | | H04W 4/38 |
| 10,732,621 B2* | 8/2020 | Cella | | G01M 13/045 |
| 10,757,549 B2* | 8/2020 | Ganz | | H04W 4/33 |
| 10,992,024 B2* | 4/2021 | Charvat | | G01S 5/0284 |
| 11,050,133 B2* | 6/2021 | Charvat | | H01Q 9/0428 |
| 11,050,134 B2* | 6/2021 | Charvat | | G01S 5/14 |
| 11,064,184 B2* | 7/2021 | Choi | | G01B 11/2545 |
| 11,074,827 B2* | 7/2021 | Choi | | F41G 7/2293 |
| 11,126,204 B2* | 9/2021 | Abramov | | G05D 1/12 |
| 11,177,554 B2* | 11/2021 | Charvat | | H01Q 1/521 |
| 11,323,624 B2* | 5/2022 | Eckman | | H04N 23/54 |
| 11,595,008 B2* | 2/2023 | Jain | | H03F 3/45475 |
| 11,646,501 B2* | 5/2023 | Wu | | H01Q 21/065 |
| | | | | 343/702 |
| 11,682,649 B2* | 6/2023 | Babcock | | H01L 23/66 |
| | | | | 257/659 |
| 11,688,929 B2* | 6/2023 | Charvat | | H01Q 1/247 |
| | | | | 455/41.1 |
| 11,693,432 B1* | 7/2023 | Clark | | G05D 1/1064 |
| | | | | 701/120 |
| 11,733,372 B1* | 8/2023 | Clark | | G01S 13/86 |
| | | | | 342/125 |
| 2003/0151556 A1* | 8/2003 | Cohen | | H01Q 5/371 |
| | | | | 343/702 |
| 2006/0178142 A1* | 8/2006 | Lovberg | | H04B 1/38 |
| | | | | 455/431 |
| 2010/0058564 A1* | 3/2010 | Henderson | | A41F 1/00 |
| | | | | 24/306 |
| 2013/0016023 A1* | 1/2013 | Gaucher | | H01Q 3/26 |
| | | | | 343/904 |
| 2013/0023210 A1* | 1/2013 | Rofougaran | | H01Q 1/2283 |
| | | | | 455/41.1 |
| 2013/0162491 A1* | 6/2013 | Yu | | H01Q 19/30 |
| | | | | 343/819 |
| 2016/0200140 A1* | 7/2016 | Souder | | B60B 30/10 |
| | | | | 254/133 R |
| 2016/0363663 A1* | 12/2016 | Mindell | | G01S 5/0247 |
| 2016/0363664 A1* | 12/2016 | Mindell | | G01S 13/785 |
| 2017/0181118 A1* | 6/2017 | Charvat | | H04W 4/023 |
| 2017/0363709 A1* | 12/2017 | Charvat | | H01Q 9/26 |
| 2018/0226367 A1* | 8/2018 | Babcock | | H03F 1/347 |
| 2019/0036224 A1* | 1/2019 | McCollough | | H04B 7/10 |
| 2019/0063881 A1* | 2/2019 | Abramov | | B64U 70/92 |
| 2019/0068953 A1* | 2/2019 | Choi | | G02B 26/0833 |
| 2019/0088156 A1* | 3/2019 | Choi | | G06T 11/60 |
| 2020/0041234 A1* | 2/2020 | Abramov | | G05D 1/12 |
| 2020/0103492 A1* | 4/2020 | Zai | | G01S 5/0218 |
| 2020/0106538 A1* | 4/2020 | Zai | | H04B 17/3911 |
| 2020/0189731 A1* | 6/2020 | Mistry | | B64U 10/60 |
| 2020/0225684 A1* | 7/2020 | Anderson | | B64U 70/95 |
| 2020/0343940 A1* | 10/2020 | Charvat | | H04B 3/52 |
| 2020/0357756 A1* | 11/2020 | Wallis | | F21V 23/006 |
| 2021/0171197 A1* | 6/2021 | Anderson | | B64U 20/83 |
| 2021/0387237 A1* | 12/2021 | Leighton | | B05B 1/083 |
| 2023/0038038 A1* | 2/2023 | Mielke | | G01S 7/484 |

OTHER PUBLICATIONS

U.S. Appl. No. 18/591,494, filed Feb. 29, 2024, Current Application.

* cited by examiner

CONTINUED FROM S1012A of FIG. 10A

First Varistor 1508

S1014A: obtaining, by a first varistor operatively connected to the at least one first notch filter, the third plurality of input radio frequency signals S1016A: clamping a first voltage of the third plurality of input radio frequency signals based on a first selected clamping voltage;

First Radio Transceiver Interface 1512

S1018A: receiving, by a first radio transceiver interface, operatively connected to the first varistor, the third plurality of input radio frequency signals

CONTINUED WITH S1020 of FIG. 12A

FIG. 10B

CONTINUED FROM S1012B of FIG. 12A

---
Second Varistor 1708

S1014B: obtaining, by a second varistor, operatively connected to the at least one second notch filter, the sixth plurality of input radio frequency signals S1016B: clamping, by the second varistor, a second voltage of the sixth plurality of input radio frequency signals based on a second selected clamping voltage;

---
Second Radio Transceiver Interface 1712

S1018B: receiving, by a second radio transceiver interface, operatively connected to the second varistor, the sixth plurality of input radio frequency signals

---

CONTINUED WITH S1020 of FIG. 14A

FIG. 12B

```
┌─────────────────────────┐  ┌─────────────────────────┐
│ CONTINUED FROM S1018A   │  │ CONTINUED FROM S1018B   │
│      of FIG. 10B        │  │      of FIG. 12B        │
└─────────────────────────┘  └─────────────────────────┘
```

S1020: obtaining, by a first radio transceiver operatively connected to the first radio transceiver interface, the third plurality of input radio frequency signals S1022: obtaining, by a second radio transceiver operatively connected to the second radio transceiver interface, the sixth plurality of input radio frequency signals S1024: obtaining, by a first processor of a flight controller operatively connected to the first radio transceiver, the third plurality of input radio frequency signals S1026: obtaining, by a second processor of a navigation system operatively connected to the second radio transceiver, the sixth plurality of input radio frequency signals S1028: generating, by the second processor, three-dimensional position information associated with the unmanned aerial vehicle based on the sixth plurality of input radio frequency signals S1030: obtaining, by the first processor of the flight controller, the three-dimensional position information from the second processor of the navigation system S1032: generating, by the first processor, a plurality of control signals to direct movement of the unmanned aerial vehicle based on the third plurality of input radio frequency signals and the three-dimensional position information CONTINUED WITH S1030 of FIG. 14B

FIG. 14A

CONTINUED FROM S1028 of FIG. 14A

S1034: obtaining, by a plurality of electronic speed controllers via a voltage feedthrough connector operatively connected to the flight controller, the plurality of control signals S1036: generating, by the plurality of electronic speed controllers, a first plurality of motor speed signals based on the plurality of control signals provided by the flight controller S1038: obtaining, by a plurality of high power filters operatively connected to a respective electronic speed controller, the respective motor speed signals generated by the respective electronic speed controller S1040: filtering, by the plurality of high power filters, the respective motor speed signals to generate respective filtered motor speed signals S1042: obtaining, by at least one electric motor electrically connected to at least one high power filter of the plurality of high power filters, the respective filtered motor speed signals S1044: rotating, by the at least one electric motor, at least one propeller operatively connected to the at least one electric motor based on the respective filtered motor speed signals

FIG. 14B

SYSTEM AND APPARATUS FOR A HIGH-POWER MICROWAVE SENSOR USING AN UNMANNED AERIAL VEHICLE

REFERENCE TO RELATED APPLICATIONS

The present application is a continuation of U.S. patent application Ser. No. 17/715,743, filed Apr. 7, 2022 and entitled "SYSTEM AND APPARATUS FOR A HIGH-POWER MICROWAVE SENSOR USING AN UNMANNED AERIAL VEHICLE," which claims priority to and the benefit of Provisional Patent Application Ser. No. 63/260,095, filed Aug. 9, 2021 and entitled "SYSTEM AND APPARATUS FOR A HIGH-POWER MICROWAVE SENSOR USING AN UNMANNED AERIAL VEHICLE," the entire contents of which are hereby incorporated by reference herein.

FIELD OF THE INVENTION

The present invention generally relates to a system and apparatus for a high-power microwave sensor using an unmanned aerial vehicle.

BACKGROUND

In certain environments, unmanned aerial vehicles are used to perform surveillance and other related tasks. One problem facing those conditions is that high power microwave measuring and generating systems often disable and disrupt the operation of unmanned aerial vehicles. The problem is further enhanced by the fact that such unmanned aerial vehicles need to be remotely controlled while carrying and potentially enabling various sensors and payloads. It would therefore be beneficial to provide an unmanned aerial vehicle that is resistant to high power microwaves yet enabled to maintain communication with remote control and navigation devices.

SUMMARY

In view of the above, it is the object of the present disclosure to provide a system and apparatus to overcome the technological challenges faced in conventional high power microwave sensors used in conjunction with unmanned aerial vehicles.

In embodiments, an unmanned aerial vehicle may include a) a central body that may include: i) a first enclosure that may include: 1. a first top wall; 2, a first bottom wall; 3. at least one first side wall connecting the first top wall and the first bottom wall such that the first top wall, the first bottom wall, and the at least one first side wall define a first chamber; wherein the first top wall, the first bottom wall, and the at least one first side wall may include a first continuous covering of a first conductive material on a first outer surface thereof to inhibit electromagnetic fields; 4. a plurality of low voltage components positioned in the first chamber, and wherein the plurality of low voltage components may include: 1) a first signal processing system that may include: a. a first antenna interface operatively connected to a first antenna outside the central body and configured to receive a first plurality of input radio frequency signals; b. at least one first bandpass filter, wherein the at least one first bandpass filter is operatively connected to the first antenna interface, and wherein the at least one first bandpass filter is configured to: i. obtain, from the first antenna via the first antenna interface, the first plurality of input radio frequency signals; and ii. filter the first plurality of input radio frequency signals to provide a second plurality of input radio frequency signals; c. at least one first notch filter, wherein the at least one first notch filter is operatively connected to the at least one first bandpass filter, and wherein the at least one first notch filters is configured to: i. obtain, from the at least one first bandpass filter, the second plurality of input radio frequency signals; and ii. filter the second plurality of radio frequency signals to attenuate a first desired range of frequencies and provide a third plurality of input radio frequency signals; c. a first varistor operatively connected to the at least one first notch filter and configured to: i. obtain, from the at least one first notch filter, the third plurality of input radio frequency signals; and ii. clamp a first voltage of the third plurality of input radio frequency signals based on a first selected clamping voltage; d. a first radio transceiver interface operatively connected to the first varistor configured to receive the third plurality of input radio frequency signals; 2) a first radio transceiver operatively connected to the radio transceiver interface and configured to receive the third plurality of input radio frequency signals, 3) a flight controller operatively connected to the first radio transceiver and configured to receive the third plurality of input radio frequency signals and provide a plurality of control signals to direct movement of the unmanned aerial vehicle based on the third plurality of input radio frequency signals; 4) a second signal processing system that may include: a. a second antenna interface operatively connected to a second antenna outside the central body and configured to receive a fourth plurality of input radio frequency signals; b. at least one second bandpass filter, wherein the at least one second bandpass filter is operatively connected to the second antenna interface, and wherein the at least one second bandpass filter is configured to: i. obtain, from the second antenna interface, the fourth plurality of input radio frequency signals; and ii . . . filter the fourth plurality of radio frequency signals to provide a fifth plurality of radio frequency signals; c. at least one second notch filter, wherein the at least one second notch filter is operatively connected to the at least one second bandpass filter, and wherein the at least one second notch filter is configured to: i. obtain, from the at least one second bandpass filter, the fifth plurality of input radio frequency signals; and ii. filter the fifth plurality of radio frequency signals to attenuate a second desired range of frequencies and provide a sixth plurality of radio frequency signals; d. a second varistor operatively connected to the at least one second notch filter and configured to: i. obtain, from the at least one second notch filter, the sixth plurality of input radio frequency signals; and ii. clamp a second voltage of the sixth plurality of input radio frequency signals based on a second selected clamping voltage; c. a second radio transceiver interface operatively connected to the second varistor and configured to receive the sixth plurality of input radio frequency signals; 5) a second radio transceiver operatively connected to the second radio transceiver interface and configured to receive the sixth plurality of input radio frequency signals; 6) a navigation system operatively connected to the second radio transceiver and configured to receive the sixth plurality of input radio frequency signals, and generate three-dimensional position information associated with the unmanned aerial vehicle in three-dimensional space based on the sixth plurality of input radio frequency signals; ii) a voltage feedthrough connector operatively connected to the flight controller and the navigation system in the first enclosure, and configured to provide power from a power distribution module in a second enclosure; iii) the second enclosure operatively connected to the first enclosure that may include: 1. a second top wall; 2. a second bottom wall; 3. at least one second side wall connecting the second top wall and the second bottom wall such that the second top wall, the second bottom wall, and the at least one second side wall define a second chamber; wherein the second top wall, the second bottom wall, and the at least one second side wall may include a second continuous covering of a second conductive material on a second outer surface thereof to inhibit electromagnetic fields; 4. a plurality of high voltage components positioned in the second chamber, and wherein the plurality of high voltage components may include: a. a plurality of electronic speed controllers operatively connected to the flight controller via the voltage feedthrough connector, and configured to: i. obtain the plurality of control signals provided by the flight controller; and ii. generate a first plurality of motor speed signals based on the plurality of control signals provided by the flight controller; b. the power distribution module operatively connected to the flight controller via the voltage feedthrough connector and operatively connected to each electronic speed controller of the plurality of electronic speed controllers, wherein the power distribution module is configured to distribute a low voltage power input to the flight controller via the voltage feedthrough connector, and wherein the power distribution module is configured to distribute a high voltage input to the plurality of electronic speed controllers; c. an input power interface operatively connected to a voltage source outside the central body via an input power filter, wherein the voltage source is configured to provide power to the power distribution module; and d. a plurality of high power filters, wherein each respective high power filter is operatively connected to a respective electronic speed controller of the plurality of electronic speed controllers, and wherein each high power filter is configured to: i. obtain respective motor speed signals generated by the respective electronic speed controller; and ii. filter the respective motor speed signals to generate respective filtered motor speed signals; b) at least one electric motor operatively connected to the central body and electrically connected to at least one high power filter of the plurality of high power filters, the at least one electric motor operatively connected to at least one propeller such that the at least one propeller is rotatable by the at least one electric motor, and wherein each respective at least one electric motor is configured to: obtain the respective filtered motor speed signals from the at least one high power filter; and rotate the at least one propeller based on the respective filtered motor speed signals; and c) a barometric pressure feedthrough having a first length and a first diameter and configured to pass air through the central body of the unmanned aerial vehicle.

In embodiments, the first enclosure may include a first electromagnetic interference gasket.

In embodiments, the first chamber is a three-dimensional polyhedron, a cube, and/or a cylinder, to name a few.

In embodiments, the first conductive material may include aluminum with a class 2 Alodine coating, and/or nickel.

In embodiments, the first enclosure inhibits electromagnetic fields by at least 40 decibels.

In embodiments, the first antenna is further configured to transmit a first plurality of output radio frequency signals.

In embodiments, the first plurality of input radio frequency signals is a range that includes at least a transmission frequency range and the first desired range of frequencies.

In embodiments, the transmission frequency range includes 900 MHz band.

In embodiments, the second plurality of input radio frequency signals is a range that includes at least the transmission frequency range and the first desired range of frequencies.

In embodiments, the first desired range of frequencies is L-band, S-band, C-band, X-band, and/or ultrawide band, to name a few.

In embodiments, the third plurality of input radio frequency signals may include flight control information.

In embodiments, the flight control information is transmitted by a remote control.

In embodiments, the remote control is located physically apart from the unmanned aerial vehicle.

In embodiments, the flight controller may include a first processor.

In embodiments, the flight controller may include first memory.

In embodiments, the first memory may include control information accessed by the flight controller to provide the plurality of control signals.

In embodiments, the control information is provided in advance via a wired connection.

In embodiments, the first memory is removeable memory.

In embodiments, the control information is provided in advance via the removeable memory.

In embodiments, the flight controller may include a gyroscope, an altimeter, a barometer, and/or a magnetometer, to name a few.

In embodiments, the second antenna is further configured to transmit a second plurality of output radio frequency signals.

In embodiments, the fourth plurality of input radio frequency signals is a range that includes at least a navigation frequency range and the second desired range of frequencies.

In embodiments, the navigation frequency range includes 1575.42 MHz band, and/or 1227.6 MHz band.

In embodiments, the fifth plurality of radio frequency signals is a range that includes at least the navigation frequency range and the second desired range of frequencies.

In embodiments, the second desired range of frequencies is L-band, S-band, C-band, X-band, and/or ultrawide band, to name a few.

In embodiments, the second desired range of frequencies is the same as the first desired range of frequencies.

In embodiments, the second desired range of frequencies is different from the first desired range of frequencies.

In embodiments, the second radio transceiver is further configured to receive the three-dimensional position information from the navigation system and transmit the three-dimensional positional information to the remote control.

In embodiments, the navigation system may include a gyroscope, an accelerometer, and/or a magnetometer, to name a few.

In embodiments, the second enclosure may include a second electromagnetic interference gasket.

In embodiments, the second chamber is a three-dimensional polyhedron, a cube, or a cylinder, to name a few.

In embodiments, the second conductive material may include aluminum with a class 2 Alodine coating and/or nickel.

In embodiments, the second enclosure inhibits electromagnetic fields by at least 40 decibels.

In embodiments, the second enclosure is a Faraday cage.

In embodiments, the power distribution module is further configured to measure the current drawn by each high power component of plurality of high power components, and measure the voltage across each high power component of the plurality of high power components.

In embodiments, the voltage source may include one or more batteries.

In embodiments, the one or more batteries are lithium polymer batteries.

In embodiments, the one or more batteries may include a plurality of cells.

In embodiments, the voltage source is rechargeable.

In embodiments, the at least one electric motor has at least one phase.

In embodiments, each respective phase is operatively connected to a respective high power filter of the plurality of high power filters.

In embodiments, each propeller has two or more blades.

In embodiments, each propeller has three blades.

In embodiments, the at least one motor is mounted to a respective mounting rod of a plurality of mounting rods.

In embodiments, the at least one motor is a three-phase motor.

In embodiments, the unmanned aerial vehicle may include at least 2 motors and each motor is connected to at least one respective propeller.

In embodiments, the unmanned aerial vehicle may include at least 4 motors, at least 6 motors, or at least 8 motors, to name a few.

In embodiments, each motor is connected to at least 2 respective propellers.

In embodiments, the unmanned aerial vehicle may include at least one support rod, wherein each support rod is connected to the central body via a respective support rod interface of the plurality of support rod interfaces.

In embodiments, the barometric pressure feedthrough is configured to assist the operation of the altimeter of the flight controller.

In embodiments, the ratio of the first length to the first diameter is at least 9 to 1, and/or at least 10 to 1, to name a few In embodiments, the ratio of the first length to the first diameter is not greater than 20 to 1.

In embodiments, the barometric pressure feedthrough is a conductive pipe.

In embodiments, the unmanned aerial vehicle further may include a payload.

In embodiments, the payload may include an electromagnetic field measurement chamber.

BRIEF DESCRIPTION OF THE DRAWINGS

The above and related objects, features and advantages of the present disclosure will be more fully understood by reference to the following detailed description of the preferred, albeit illustrative, embodiments of the present invention when taken in conjunction with the accompanying figures, wherein:

FIGS. 10A and 10B are schematic diagrams of a process flow for an unmanned aerial vehicle in accordance with embodiments of the present invention.

FIGS. 12A and 12B are schematic diagrams of a process flow for an unmanned aerial vehicle in accordance with embodiments of the present invention.

FIGS. 14A and 14B are schematic diagrams of a process flow for an unmanned aerial vehicle in accordance with embodiments of the present invention.

DETAILED DESCRIPTION OF THE EXEMPLARY EMBODIMENTS

The present invention generally relates to a system and apparatus for a high-power microwave sensor an unmanned aerial vehicle. In embodiments, the unmanned aerial vehicle may be used in conjunction with a remote control.

Figure 1A:
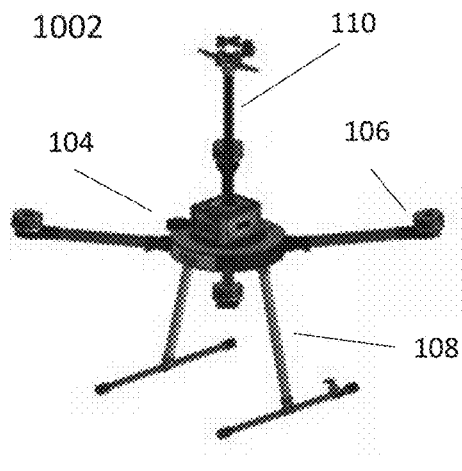
FIGS. 1A, 1B, and 1C are schematic illustrations of conventional unmanned aerial vehicles.
Figure 1B:
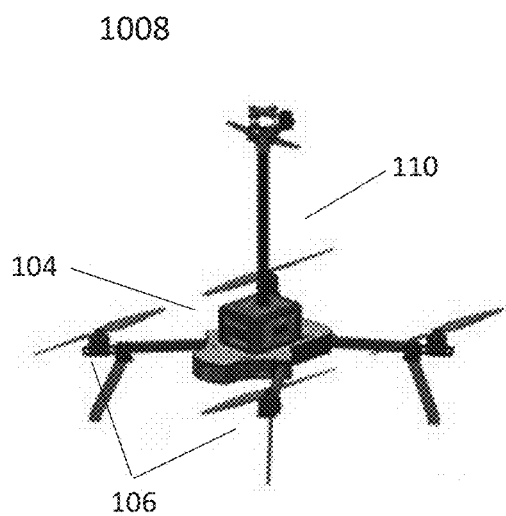
Figure 1C:
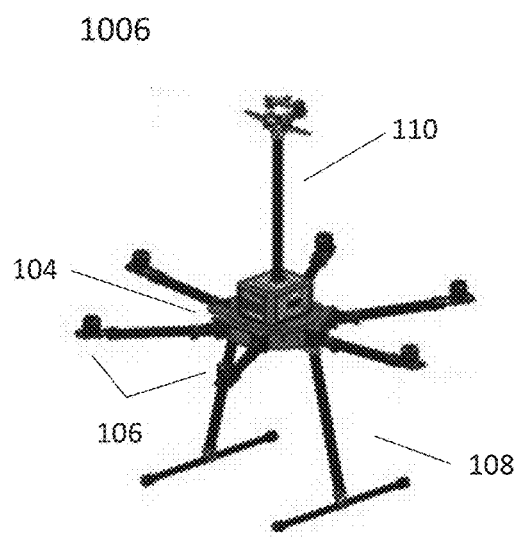
Figure 2:
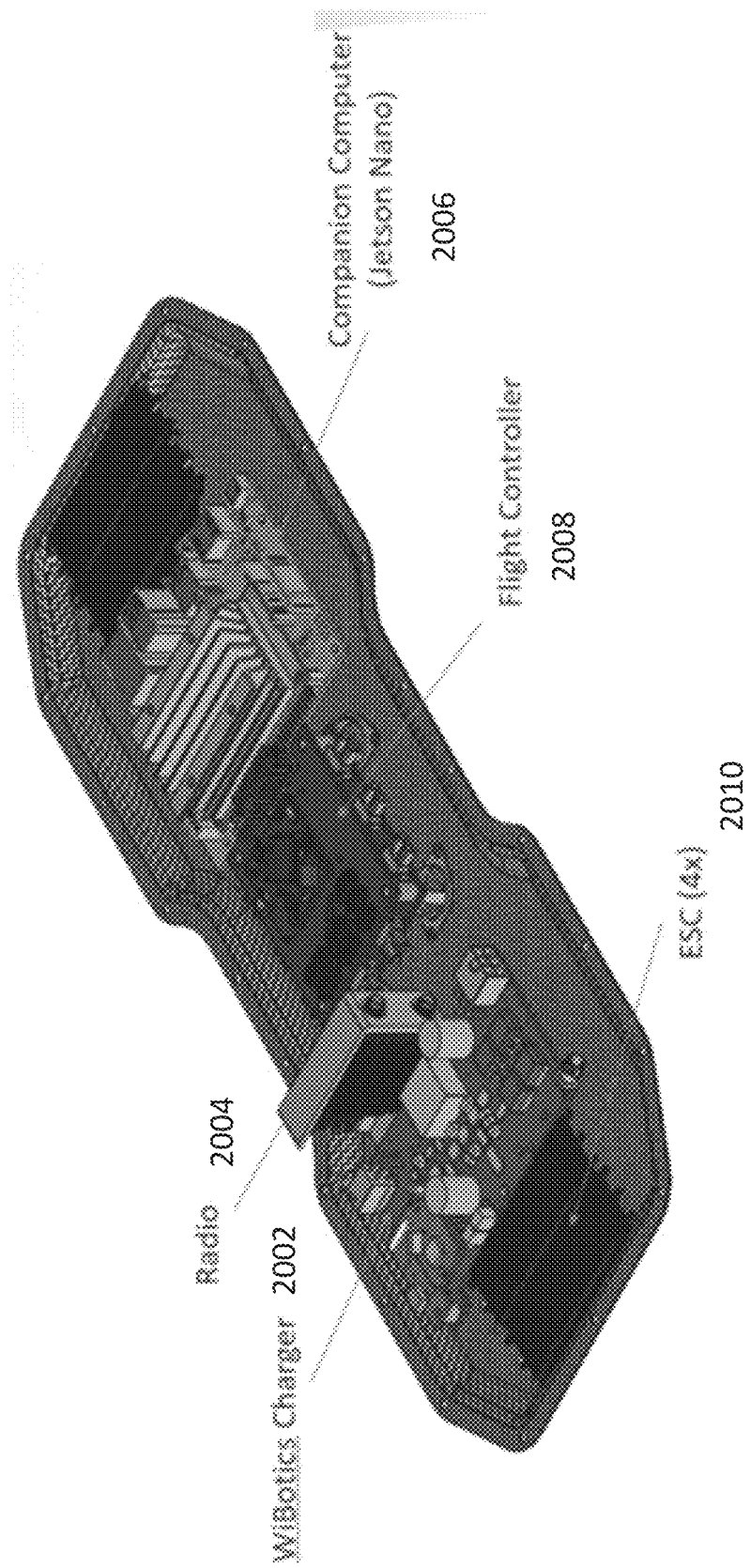
FIG. 2 is a schematic illustration of the central body of a conventional unmanned aerial vehicle.

FIGS. 1A, 1B, and 1C are schematic illustrations of various conventional unmanned aerial vehicles 1002, 1006, 1008 with representative mission payloads. In each of these vehicles 1002, 1006, 1008, a central body 104 is provided which houses electronic components (see, e.g., FIG. 2) utilized to control the flight of the unmanned aerial vehicle 1002, 1006, 1008 including operating the motors 106. By way of illustration, FIG. 2 shows an example of a conventional central body 2000 including a power source 2002, a flight controller 2008, radio 2004, electronic speed controllers 2010, and a computer processor 2006, all contained within a common chamber. FIG. 1A illustrates an exemplary unmanned aerial vehicle 1002 with four motors. FIG. 1B illustrates an exemplary unmanned aerial vehicle 1006 with four motors. FIG. 1C illustrates an exemplary unmanned aerial vehicle 1008 with six motors. Each exemplary unmanned aerial vehicle 1002, 1006, 1008 may also carry a mission payload 110 (such as illustrated here), mounted on a support structure 108 connected to the central body 104. Examples of mission payloads 110 may include, for example, a weather sensor, an electromagnetic field sensor, a digital or video camera, and/or an infrared camera, to name a few.

In certain environments, unmanned aerial vehicles are used to perform surveillance and other related tasks. For example, unmanned aerial vehicles may be used to measure the electromagnetic field around power and transmission lines, however, electromagnetic interference may also be generated around the power lines which may interfere with operation of the unmanned aerial vehicle. In addition, other electromagnetic radiation may affect the operation of the unmanned aerial vehicle. For example, high power microwave generating systems may disable and disrupt the operation of unmanned aerial vehicles. The problem introduced by electromagnetic interference is enhanced by the fact that unmanned aerial vehicles are often remotely controlled while carrying and potentially enabling various sensors and payloads such that they need to be responsive to certain electromagnetic radiation while protected from others.

In embodiments, a central body of an unmanned aerial vehicle in accordance with the present disclosure may be segregated into a plurality of chambers or separate enclosures, each of which coated with a continuous covering of conductive material on the respective outer surface thereof to inhibit electromagnetic fields from interfering with electronic components in the separate enclosures used to navigate and control the unmanned aerial vehicle. In addition, other components of the unmanned aerial vehicle, e.g., an antenna, batteries, to name a few, are located outside the enclosures and operatively connected to electronic components positioned therein through insulated interfaces, and calibrated filters. As described in greater detail, these collections of unconventional and inventive features allow unmanned aerial vehicles made in accordance with embodiments of the present invention to both shield and protect components against high power microwaves and maintain communication with remote control and navigation devices.

Figure 3:
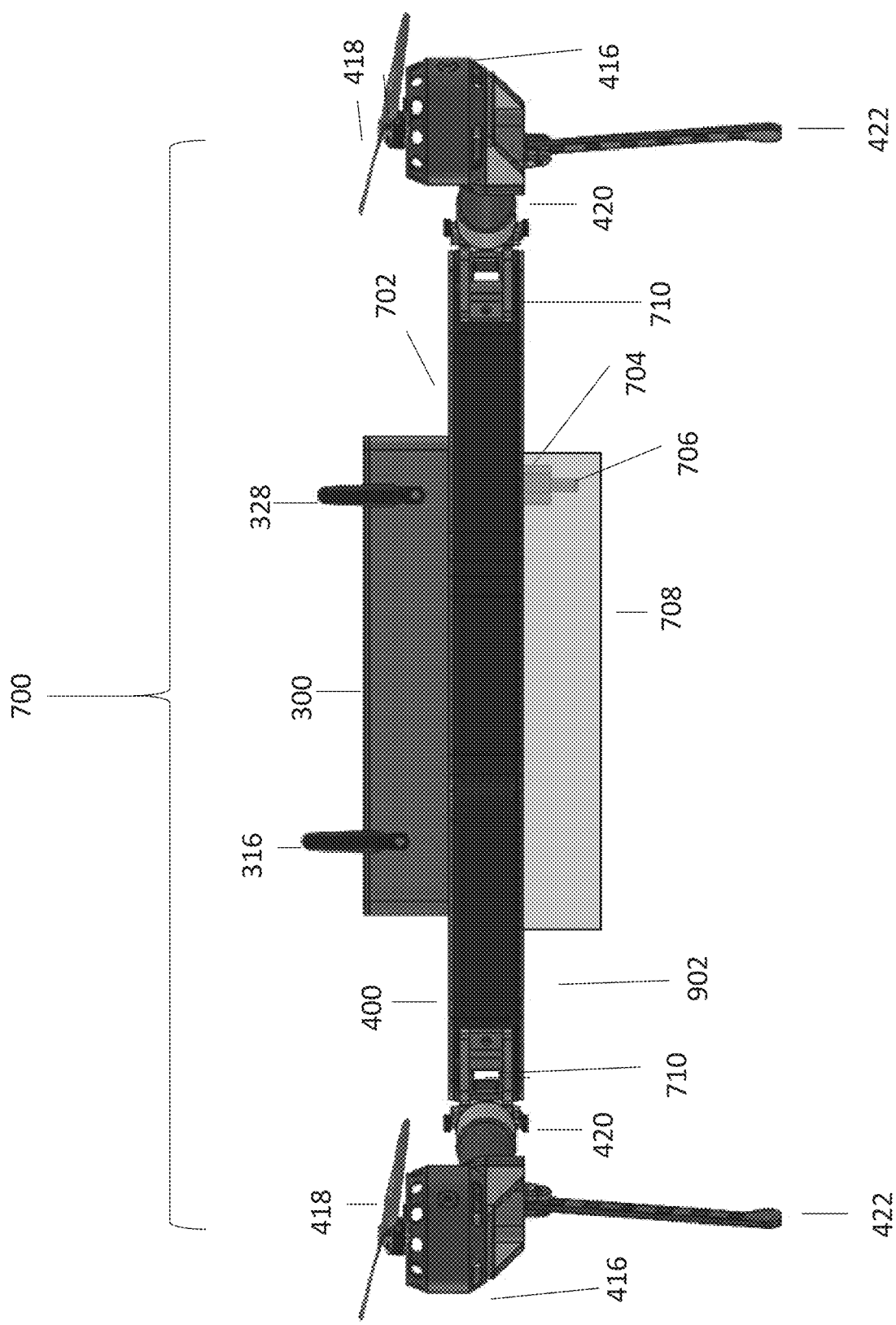
FIG. 3 is a schematic illustration of an unmanned aerial vehicle in accordance with embodiments of the present invention.
Figure 4:
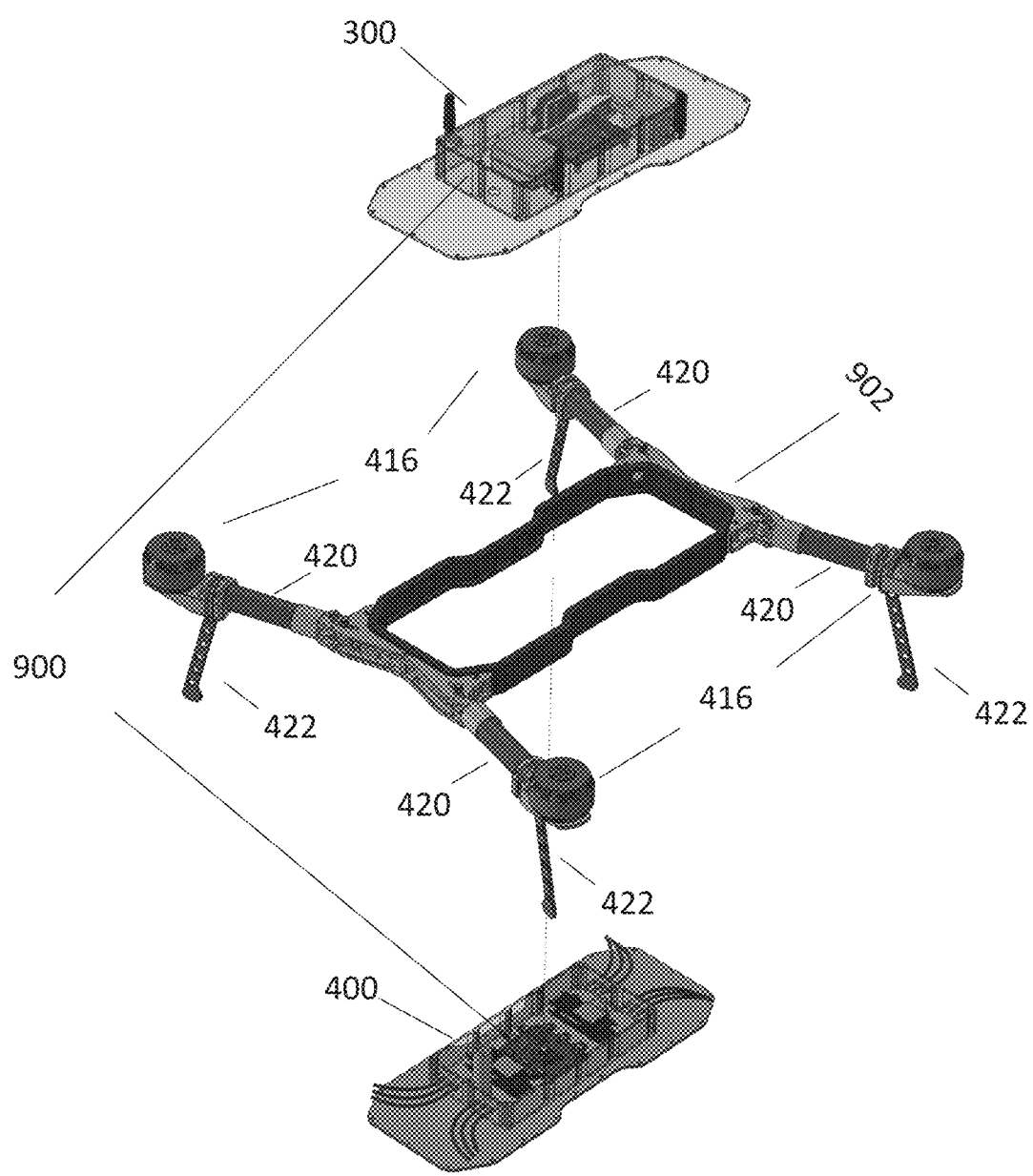
FIG. 4 is a schematic illustration of an exploded view of an unmanned aerial vehicle in accordance with embodiments of the present invention.
Figure 5:
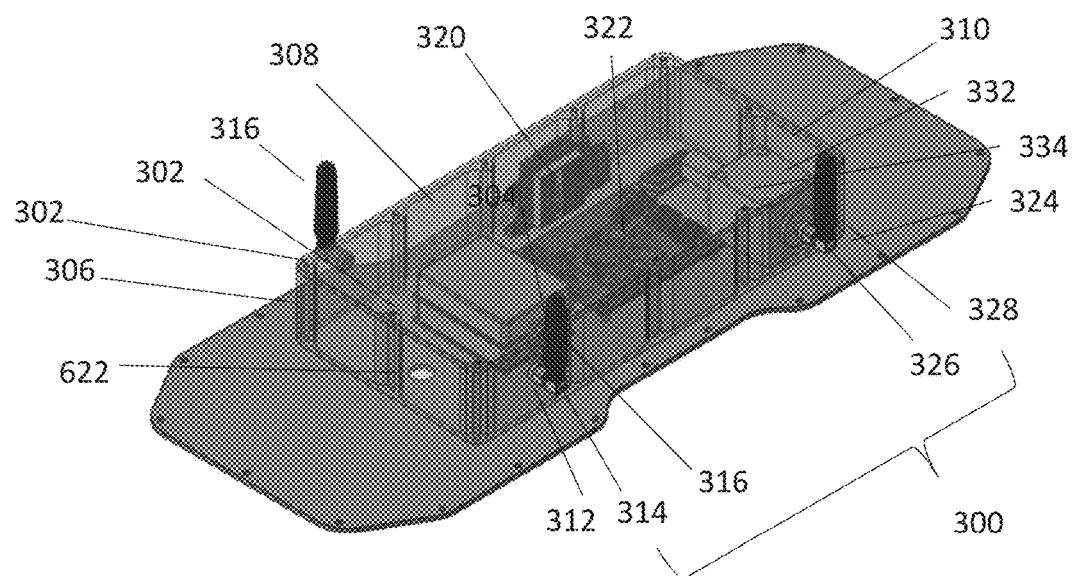
FIG. 5 is a schematic illustration of an enclosure of an unmanned aerial vehicle in accordance with embodiments of the present invention.
Figure 5A:
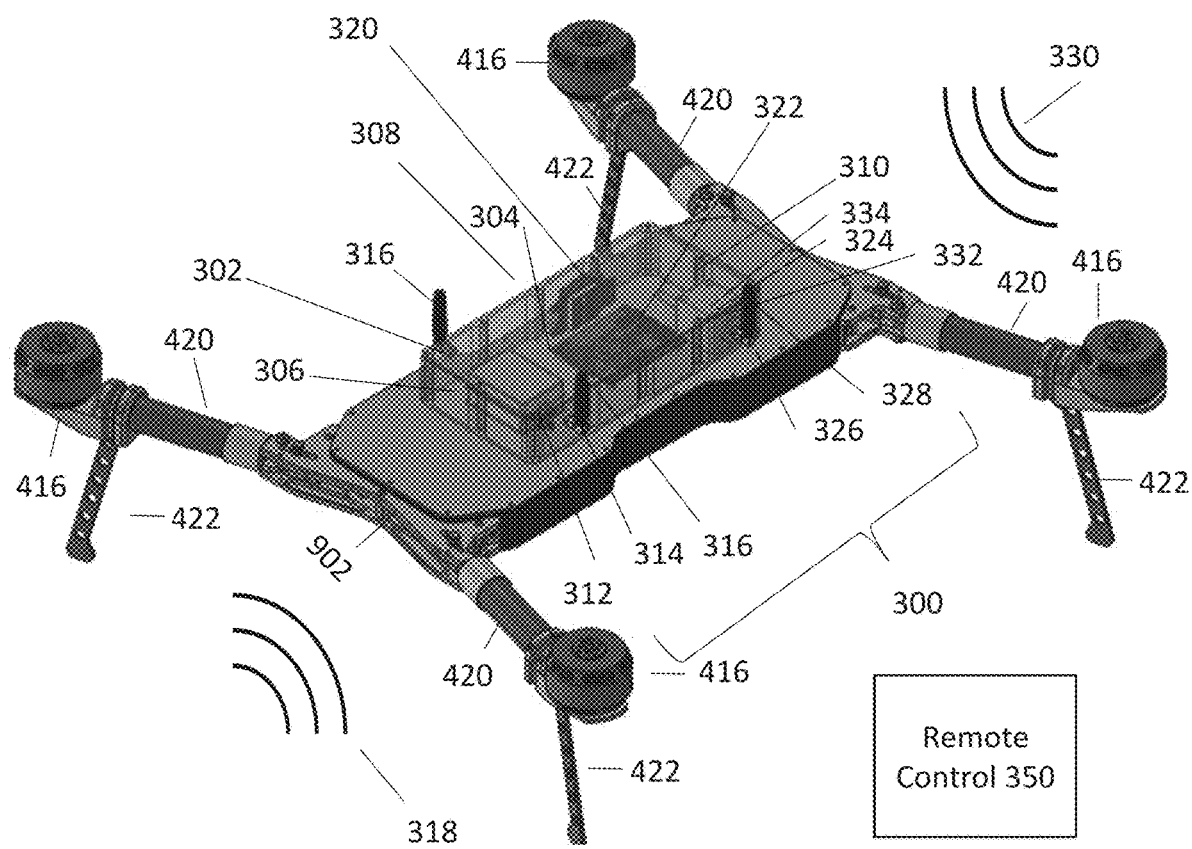
FIG. 5A is a schematic illustration of an unmanned aerial vehicle in accordance with embodiments of the present invention.
Figure 6:
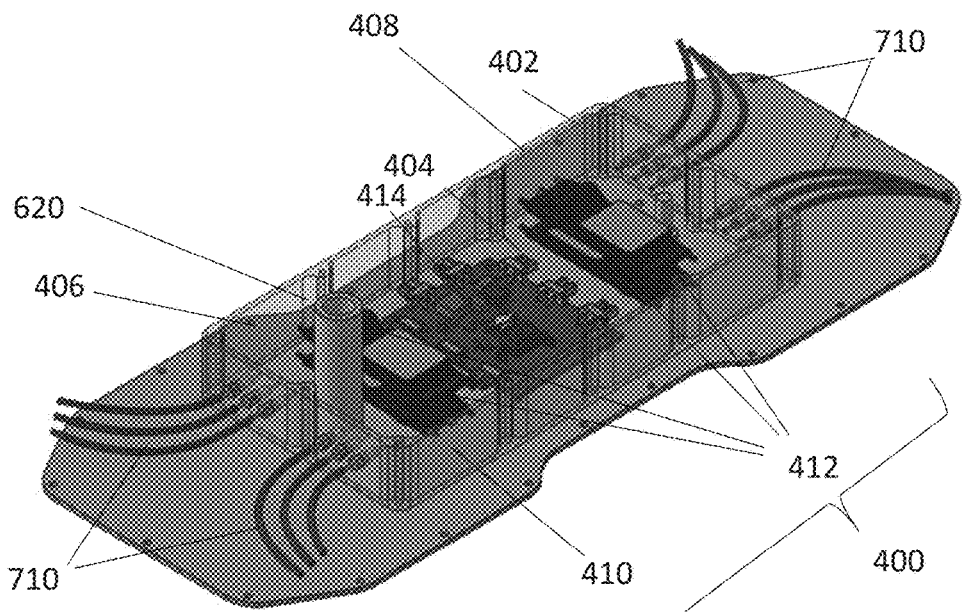
FIG. 6 is a schematic illustration of an enclosure of an unmanned aerial vehicle in accordance with embodiments of the present invention.
Figure 6A:
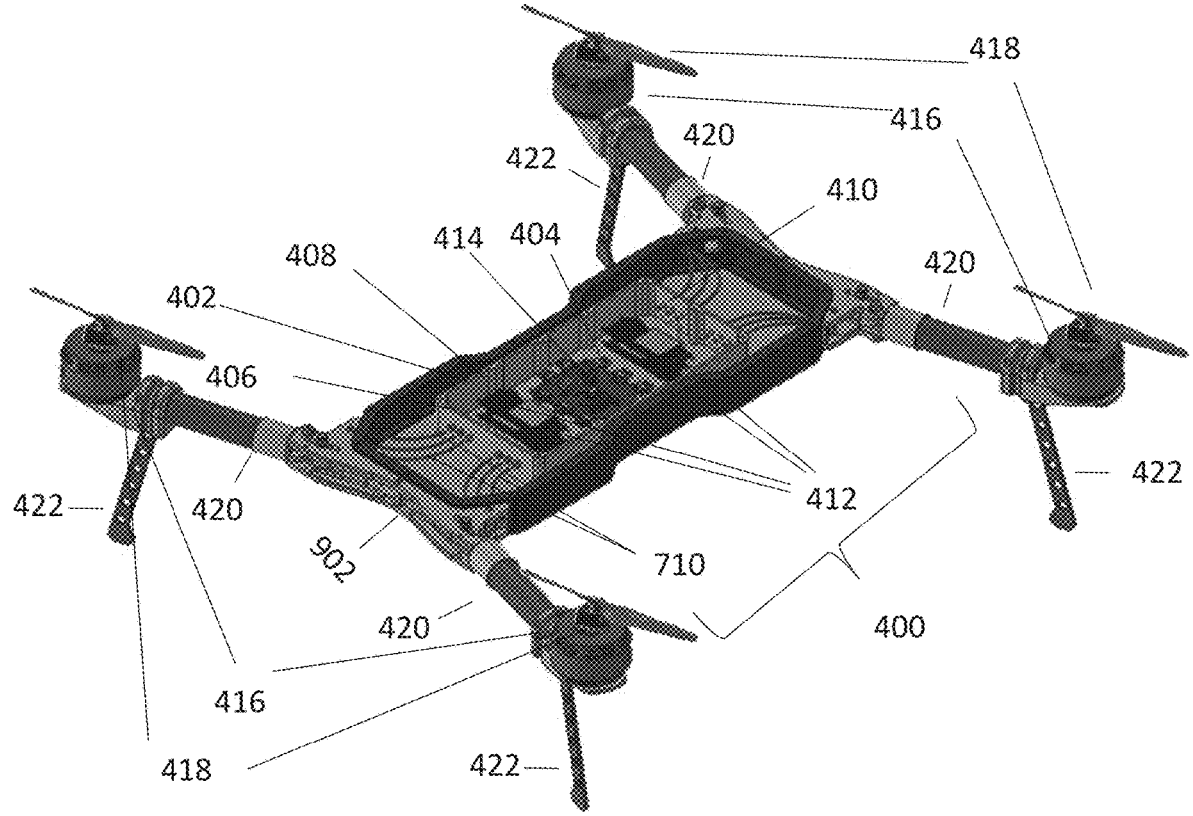
FIG. 6A is a schematic illustration of an unmanned aerial vehicle in accordance with embodiments of the present invention.
Figure 9:
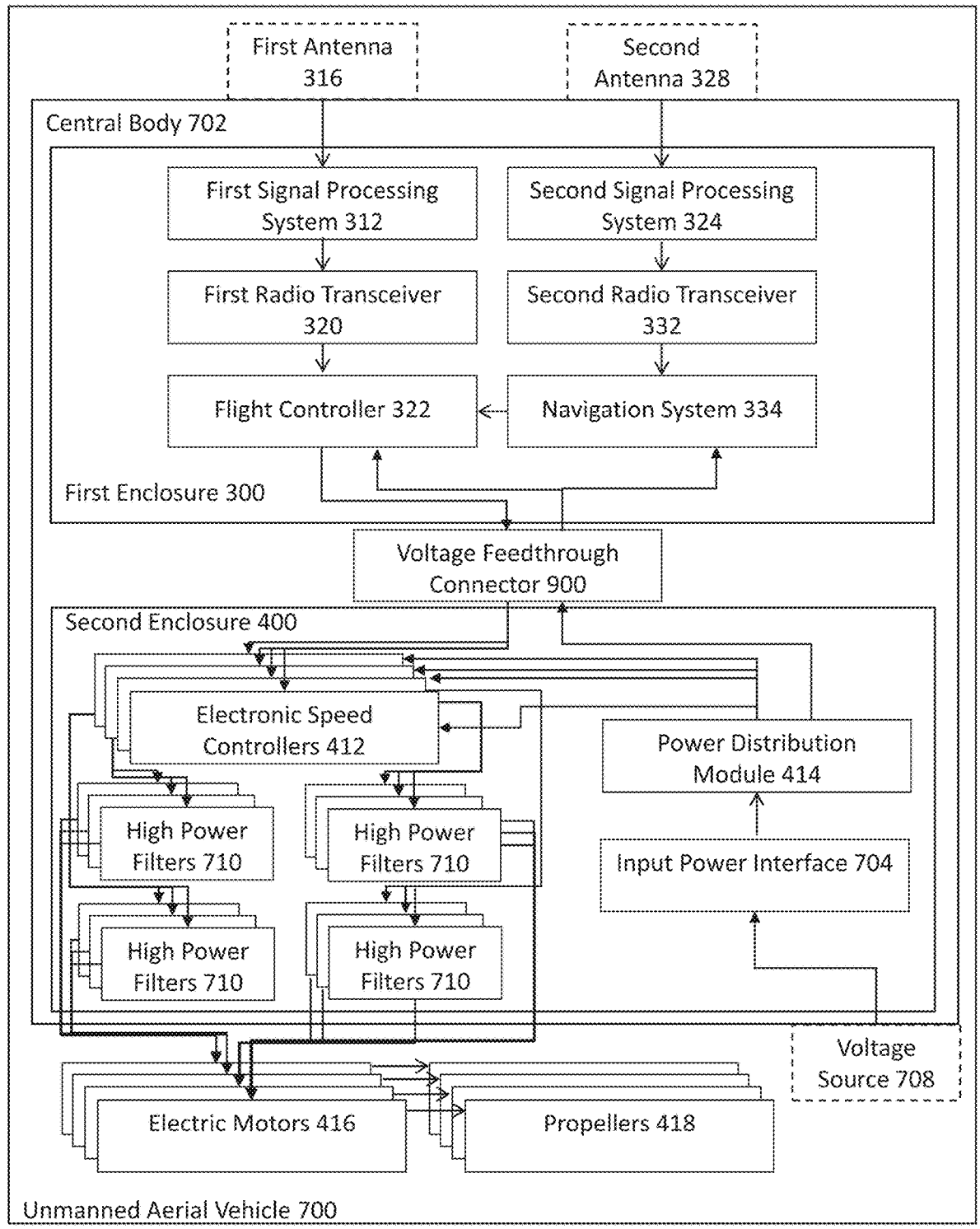
FIG. 9 is a schematic diagram of an unmanned aerial vehicle in accordance with embodiments of the present invention.

FIGS. 3-6A illustrate an exemplary unmanned aerial vehicle 700 made in accordance with embodiments of the present invention. Additionally, FIG. 9 is a schematic diagram of the components of the unmanned aerial vehicle 700 in accordance with embodiments of the present invention. In accordance with embodiments of the present invention, electronic components may be segregated into at least two separate chambers 300 and 400. In embodiments, a first enclosure 300, as illustrated in FIGS. 5 and 5A, for example, may include electronic components used for communication with and navigation of the unmanned electronic vehicle 700. In embodiments, a second enclosure 400, as illustrated in FIGS. 6 and 6A, may include electronic components used to drive the motors and power the unmanned electronic vehicle 700. It is appreciated by those skilled in the art that modifications to the design and components shown may be made without departing from the letter and spirit of the present invention.

FIG. 3 illustrates a side view of an unmanned aerial vehicle 700 in accordance with exemplary embodiments of the present invention. A first enclosure 300 is shown positioned on top of a second enclosure 400 with a voltage source 708 (e.g., battery with one or more cells) connected to the second enclosure via an input power interface 704 and an input power filter 706. In embodiments, a plurality of motors 416 are mounted on respective mounting rods 420 which are connected to a main frame 902 including the second enclosure 400, as well as the first enclosure 300. FIG. 4 illustrates an exploded view of the internal components of the second enclosure 400, the internal components of the first enclosure 300, and the frame 902 including the electric motors 416 and support rods 422. In embodiments, the support rods 422 support the frame 902.

FIG. 3 is a schematic illustration of a side view of an unmanned aerial vehicle 700 in accordance with embodiments of the present invention. In embodiments, the input power interface 704 may be operatively connected to a voltage source 708 outside the central body 702 via an input power filter 706 and an input power interface 704. In embodiments, the input power filter 706 may be, for example, a Bushing Type Feed-Thru Capacitor by Tusonix (2425-601-X5W0-103Z). In embodiments, the input power filter 706 may be, for example, an EMI Feedthrough Filter from AP Technologies (657-54F-848-005). In embodiments, the voltage source 708 may be configured to provide power to the power distribution module 414. In embodiments, the voltage source 708 may include one or more batteries. In embodiments, the one or more batteries may be lithium polymer batteries. In embodiments, the one or more batteries may include a plurality of battery cells. In embodiments, the voltage source 708 may be rechargeable.

In embodiments, the unmanned aerial vehicle may include a payload (not shown). In embodiments, the payload may be or may include an electromagnetic field measurement chamber for an electromagnetic field measurement sensor, an atmospheric characterization or measurement system, a camera, infrared camera, thermal imaging camera, and/or a high power microwave generating device to name a few.

FIG. 4 illustrates an exemplary exploded view of the unmanned aerial device 700. In embodiments, as illustrated, the second encloser 400 is mounted in the frame 902 with the first enclosure mounted on top of the second enclosure 400. In embodiments, the frame 902 includes a central opening 904 configured to receive the second enclosure 400.

FIGS. 5 and 5A illustrate the first enclosure 300 with the top removed and the sidewalls illustrated as being substantially transparent such that the internal components thereof are visible in accordance with embodiments of the present invention. FIG. 5A is a schematic illustration of an unmanned aerial vehicle 700 in accordance with embodiments of the present invention in which the components of the first enclosure 300 are visible. In embodiments, the unmanned aerial vehicle 700 may include a central body 702, at least one electric motor 416 operatively connected to the central body 702, and a barometric pressure feedthrough 620. In embodiments, the central body 702 may include the first enclosure 300. FIG. 5 is a schematic illustration of the first enclosure 300 of an unmanned aerial vehicle 700 in accordance with embodiments of the present invention. In embodiments, the first enclosure 300 may include a first top wall 302, a first bottom wall 304, and at least one first side wall 306 connecting the first top wall 302 and the first bottom wall 304 such that the first top wall 302, the first bottom wall 304, and the at least one first side wall 306 define a first chamber 308. In embodiments, the first chamber 308 may be, for example, a three-dimensional polyhedron. In embodiments, the first chamber 308 may be, for example, a cube. In embodiments, the first chamber 308 may be, for example, a cylinder. In embodiments, the first enclosure 300 may further include a first electromagnetic interference gasket (not shown). In embodiments, a first continuous covering 310 of a first conductive material may be provided on a first outer surface of the first top wall 302, the first bottom wall 304, and the at least one first side wall 306 to inhibit electromagnetic fields. In embodiments, the first enclosure 300 may be a Faraday cage. In embodiments, the first conductive material may be aluminum. In embodiments, the aluminum may be coated in Class 2 Alodine in order to protect against the loss of electoral conductivity of the covering, as well as to prevent the first continuous covering 310 from corrosion. In embodiments, the first conductive material may be nickel. In embodiments, the first continuous covering 310 may be configured to maximize the attenuation of radio frequency signals. In embodiments, attenuation involves reducing the strength of a signal (e.g., a radio frequency signal) when it moves through a material. In embodiments, the first continuous covering 310 may be configured to attenuate electromagnetic signals, and thereby inhibit electromagnetic fields by at least 40 decibels (dB). In embodiments, the first continuous covering 310 may be configured to attenuate electromagnetic signals by over 65 dB.

In embodiments, still referring to FIG. 5A, the first enclosure 300 may include a plurality of low voltage components positioned in the first chamber 308. In embodiments, the plurality of low voltage components may include a first signal processing system 312, a first radio transceiver 320, a flight controller 322, a second signal processing system 324, a second radio transceiver 332, and a navigation system 334.

Figure 10:
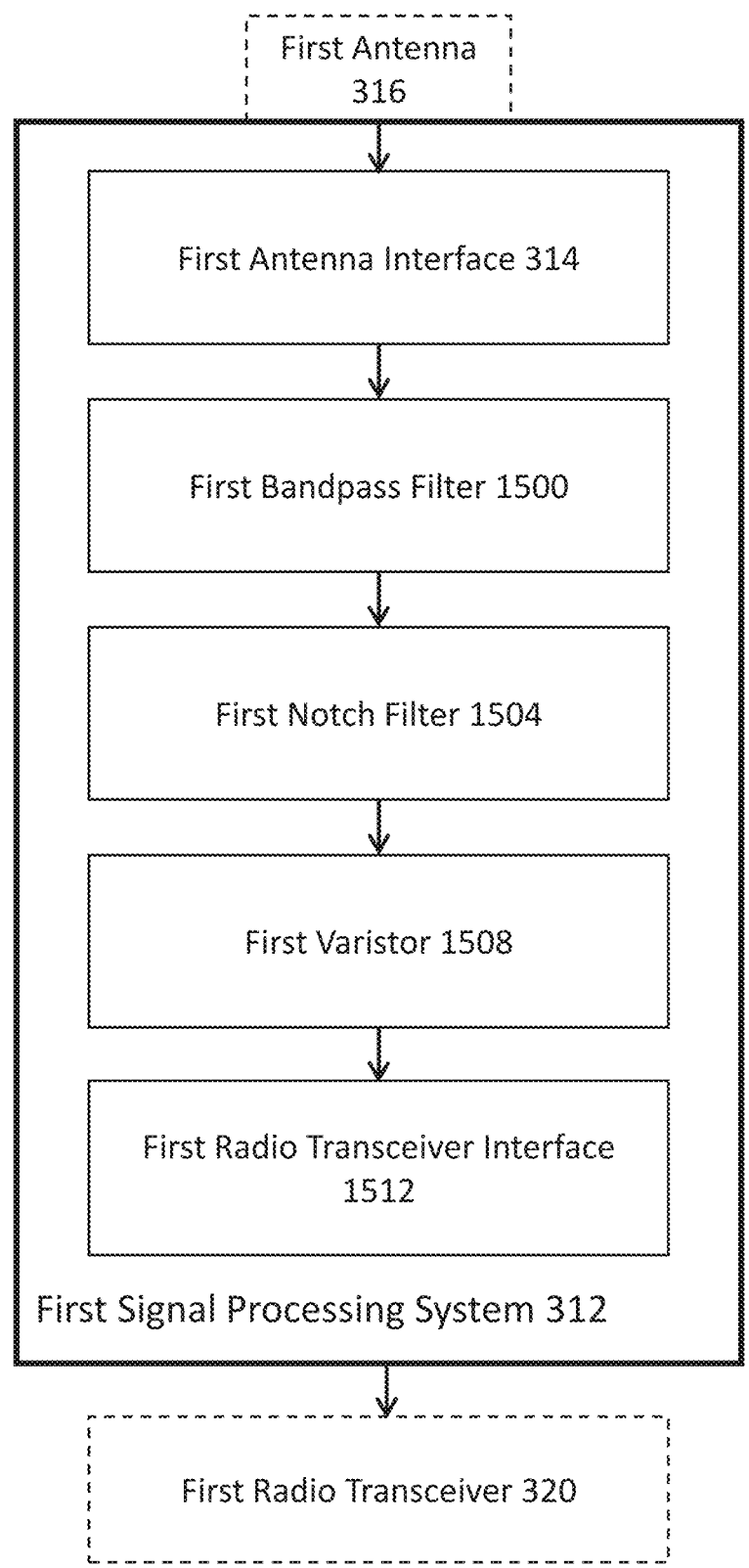
FIG. 10 is a schematic diagram of a first signal processing system of an unmanned aerial vehicle in accordance with embodiments of the present invention.

FIG. 10 is a schematic diagram of an exemplary first signal processing system 312 of an unmanned aerial vehicle 700 in accordance with embodiments of the present invention. In embodiments, referring to FIG. 10, the first signal processing system 312 may include a first antenna interface 314, at least one first bandpass filter 1500, at least one first notch filter 1504, a first varistor 1508, and a first radio transceiver interface 1512. In embodiments, the first signal processing system 312 may, for example, include a Type N/SMA F/F Bulkhead Coaxial RF Surge Protector. In embodiments, the first signal processing system 312 may, for example, include an RFD 900+ Modem (SKU MODEM-RFD900+). In embodiments, the first antenna interface 314 may be operatively connected to a first antenna 316. In embodiments, the first antenna 316 is positioned outside the central body 702 and configured to receive a first plurality of input radio frequency signals 318. In embodiments, the first antenna 316 may be further configured to transmit a first plurality of output radio frequency signals. In embodiments, the at least one first bandpass filter 1500 may be operatively connected to the first antenna interface 314. In embodiments, the at least one first bandpass filter 1500 may be configured to obtain the first plurality of input radio frequency signals 318 from the first antenna 316 via the first antenna interface 314. In embodiments, the at least one first bandpass filter 1500 may be configured to filter the first plurality of input radio frequency signals 318 to provide a second plurality of input radio frequency signals. In embodiments, for example, the first bandpass filter 1500 filters out signals outside of the frequency band from 500 MHz to 3000 MHz. Input radio frequency signals outside of this band are attenuated to provide the second plurality of input radio frequency signals.

In embodiments, the at least one first notch filter 1504 may be operatively connected to the at least one first bandpass filter 1500. In embodiments, the at least one first notch filter 1504 may be configured to obtain the second plurality of input radio frequency signals from the at least one first bandpass filter 1500. In embodiments, the at least one first notch filter 1504 may be configured to filter the second plurality of radio frequency signals to attenuate a first desired range of frequencies and provide a third plurality of input radio frequency signals. In embodiments, for example, the first desired range of frequencies to be attenuated may be L-band signals (e.g., 1000 MHz to 2000 MHz). In embodiments, for example, the first desired range of frequencies to be attenuated may be S-band signals (e.g., 2000 MHz to 4000 MHz). In embodiments, for example, the first desired range of frequencies to be attenuated may be C-band signals (e.g., 4000 MHz to 8000 MHZ). In embodiments, for example, the first desired range of frequencies to be attenuated may be X-band signals (e.g., 7000 MHz to 11200 MHZ). In embodiments, for example, the first desired range of frequencies to be attenuated may be ultrawide signals (e.g., greater than 500 MHZ). In embodiments, the first plurality of input radio frequency signals may be in a range that includes at least a transmission frequency range of a remote control device 350 that may be used to control the vehicle 700 and the first desired range of frequencies. In embodiments, for example, the transmission frequency range may include 900 MHz. In embodiments, the second plurality of input radio frequency signals may be in a frequency range that includes at least the 900 MHz band and the first desired range of frequencies. In embodiments, a high power microwave system may operate in one of the above bandwidths and the desired range may be selected or set to include that of the high power microwave system such that the frequency thereof will be attenuated.

Figure 8:
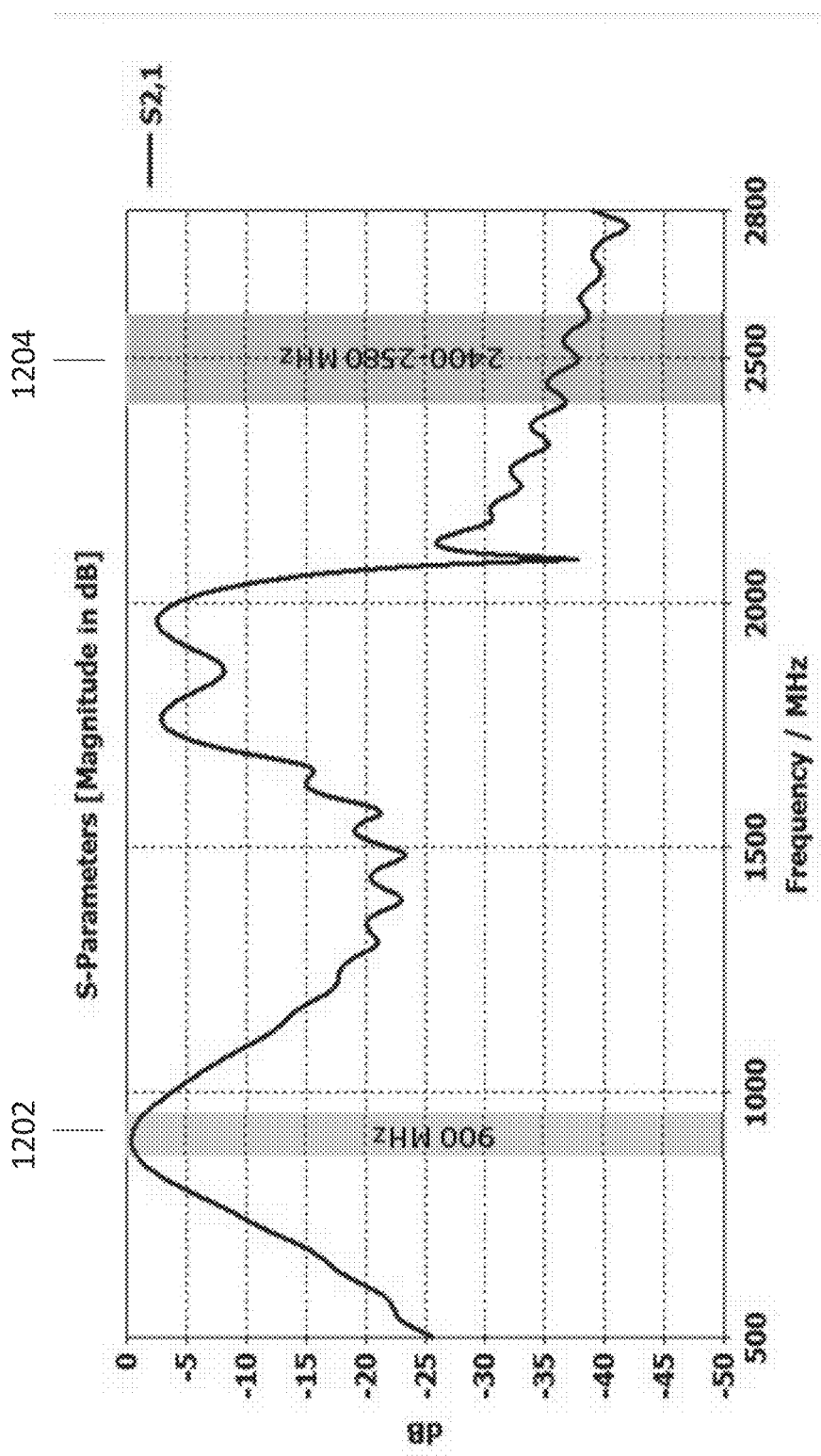
FIG. 8 is a graph depicting the attenuation of a radio frequency spectrum associated with an unmanned aerial vehicle in embodiments of the present invention.

FIG. 8 is a graph depicting exemplary attenuation of radio frequency signals associated with an unmanned aerial vehicle 700 in embodiments of the present invention. For example, in embodiments, the third plurality of frequencies includes less than 5% attenuation of radio frequency signals in the 900 MHz band (or as close to 0 dB attenuation as possible), while attenuation of radio frequency signals in the S-band frequency range may be attenuated significantly (e.g., by at least 35 to 40 dB). In embodiments, the attenuation graph depicted in FIG. 8 may vary based on the transmission frequency range and the first desired bandwidth that is being attenuated. In embodiments, radio frequency signals associated with the transmission frequency are minimally attenuated while radio frequency signals in the desired bandwidth are attenuated by at least 35-40 decibels.

In embodiments, the first varistor 1508 of the first signal processing system 312 may be operatively connected to the at least one first notch filter 1504. In embodiments, the first varistor may be configured to obtain the third plurality of input radio frequency signals from the at least one first notch filter 1504. In embodiments, the first varistor 1508 may be configured to then clamp a first voltage of the third plurality of input radio frequency signals based on a first selected clamping voltage. For example, in embodiments, if the third plurality of input radio frequency signals exceeds a specified voltage, first varistor 1508 may suppress the voltage in order to protect the circuit and the other components of the unmanned aerial vehicle 700. In embodiments, high power microwave frequency systems may transmit signals that have a frequency within one of the desired ranges of frequency to be attenuated, and may also be transmitted with a high power that may damage or interfere with the components of the vehicle 700. In embodiments, by attenuating the microwave signal, and clamping the voltage of the signal, the unmanned aerial vehicle 700 may continue to be safely operated and receive and process input radio frequencies being transmitted in the transmission frequency range.

In embodiments, still referring to FIG. 10, the first radio transceiver interface 1512 of the first signal processing system 312 may be operatively connected to the first varistor 1508. In embodiments, the first radio transceiver interface 1512 may be configured to receive the third plurality of input radio frequency signals.

In embodiments, the first radio transceiver 320 located in the first enclosure 300 may be operatively connected to the first radio transceiver interface 1512 of the first signal processing system 312. In embodiments, the first radio transceiver 320 may be configured to receive the third plurality of input radio frequency signals. In embodiments, for example, the first radio transceiver 320 may operate at 900 MHz. In embodiments, the first radio transceiver 320 may operate at any suitable radio frequency. In embodiments, the third plurality of input radio frequency signals may include flight control information. In embodiments, the flight control information may be transmitted by a remote control 350 which may be operated by a user. In embodiments, the remote control 350 may be located physically apart from the unmanned aerial vehicle 700. In embodiments, the first radio transceiver 320 may provide control information based on the flight control information.

Figure 13A:
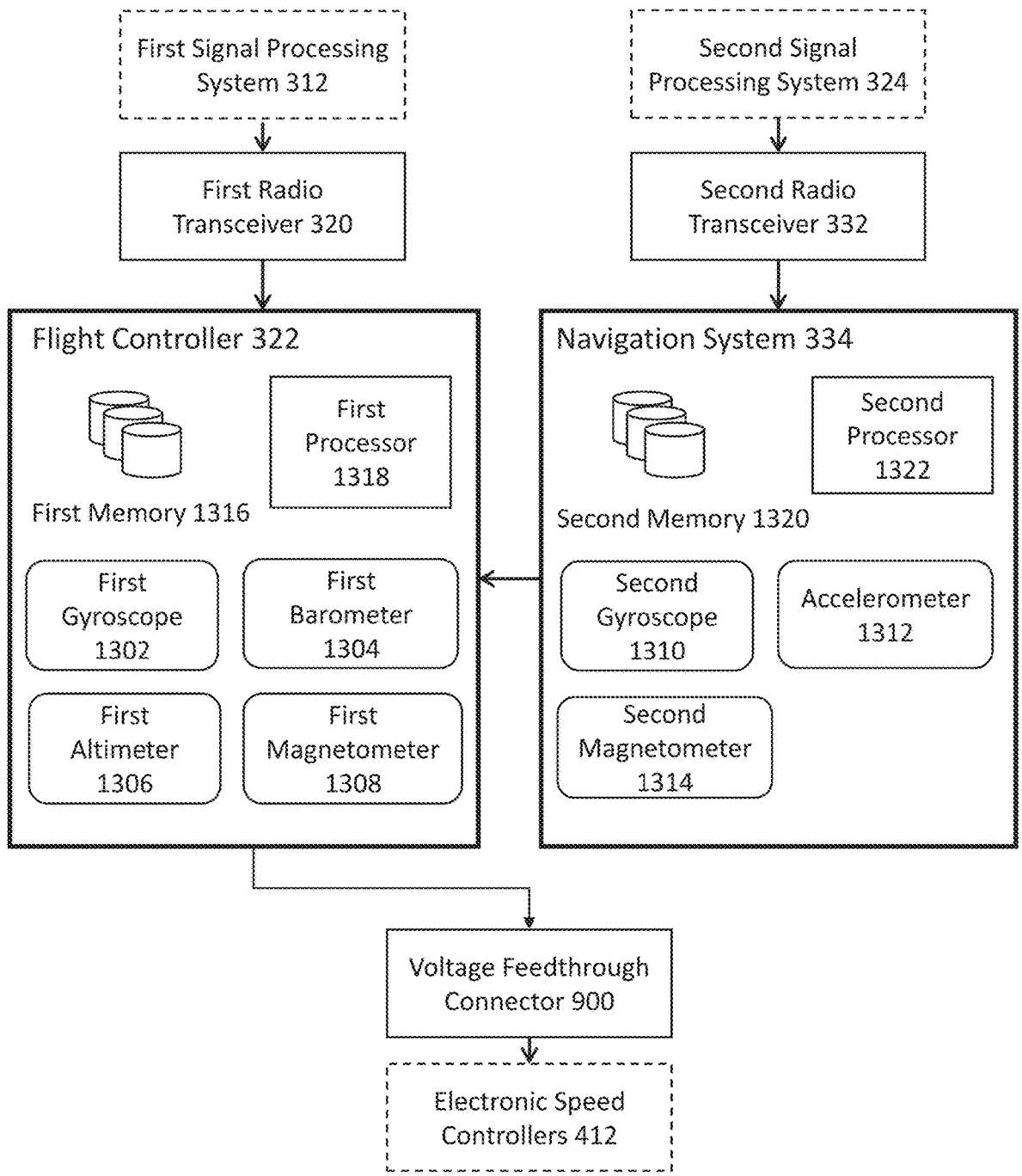
FIGS. 13A and 13B are schematic diagrams for components of an unmanned aerial vehicle in accordance with embodiments of the present invention.

FIG. 13A is a schematic diagram of the components of the flight controller 322 and the navigation system 334 of the unmanned aerial vehicle 700 in accordance with embodiments of the present invention. In embodiments, the flight controller 322 located in the first enclosure 300 may be operatively connected to the first radio transceiver 320. In embodiments, the flight controller 322 may be configured to receive the control information and provide a plurality of control signals to direct movement of the unmanned aerial vehicle 700 based on the control information. In embodiments, the flight controller 322 may include a first processor 1318 configured to process the control information to provide the control signals. In embodiments, the third plurality of input radio frequency signals may include the control information. In embodiments, the flight controller 322 may include a first gyroscope 1302, which may be configured to generate continuous pitch, yaw, and roll measurement information for the first processor 1316 to process based on control information to provide the control signals. In embodiments, the flight controller 322 may include an altimeter 1306, which may be configured to generate altitude measurement information for the first processor 1318 to the process based on the control information to provide the control signals. In embodiments, the flight controller 322 may include a barometer 1304, which may be configured to generate pressure measurement information for the first processor 1318 to process based on the control information to provide the control signals. In embodiments, the barometer 1304 may allow the flight controller 322 to determine accurate altitude information because the barometer 1304 is sensitive and can detect slight changes in air pressure when the drone changes altitude. In embodiments, the flight controller 322 may include a first magnetometer 1308, which may be configured to generate magnetic force measurement information for the first processor 1318 to process based on the control information. In embodiments, the first magnetometer 1308 may provide a heading for the system (e.g., by a compass). In embodiments, the flight controller 322 may include first memory 1316. In embodiments, the control information may be stored on the memory 1316 and accessed by the flight controller 322 in order to provide the plurality of control signals. In embodiments, the control information may be provided in advance via a wired connection. In embodiments, the first memory 1316 may be removeable memory. In embodiments, the control information may be provided in advance via the removeable memory. For example, in embodiments, the removeable memory may be an SD Card, such as a Secure Digital Card, Secure Digital High Capacity Card, a Secure Digital Extended Capacity Card, or a Micro Secure Digital Card to name a few. In embodiments, the flight controller 322 may be, for example a The Blue Cube-Pixhawk 2.1 (ASIN B07N6QZG9K) flight controller.

Figure 11:
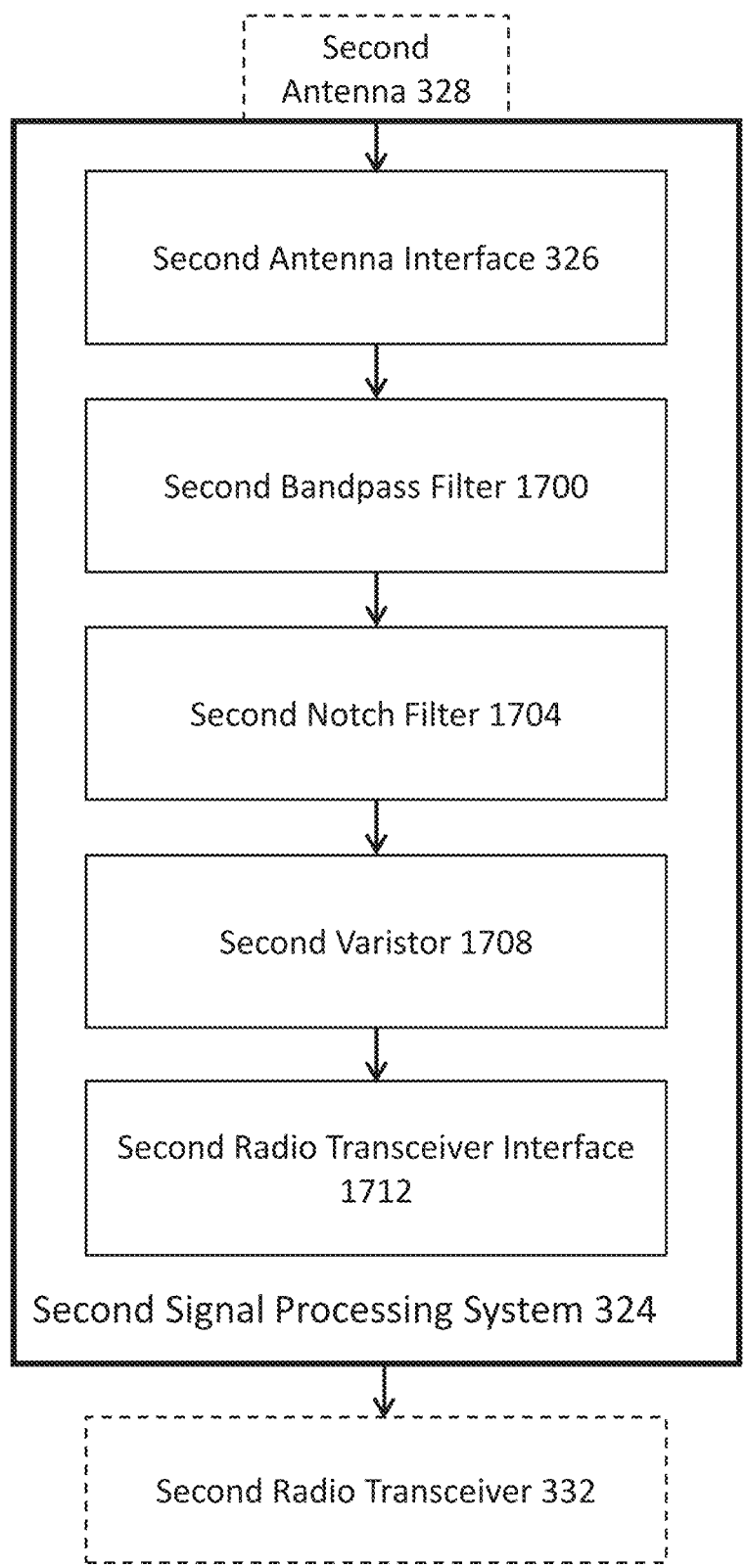
FIG. 11 is a schematic diagram of a second signal processing system of an unmanned aerial vehicle in accordance with embodiments of the present invention.
Figure 12A:
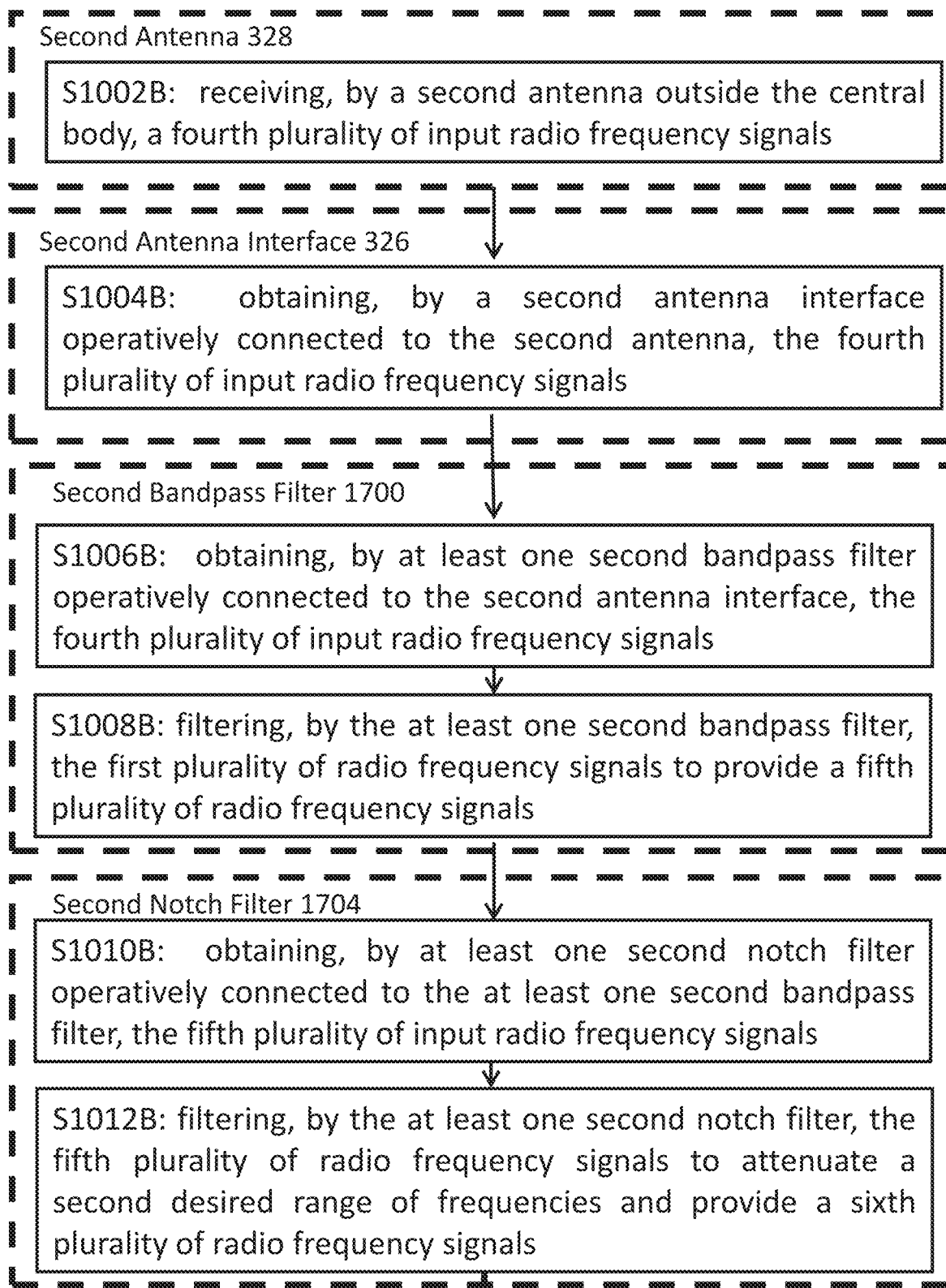

FIG. 11 is a schematic diagram of a second signal processing system 324 of an unmanned aerial vehicle 700 in accordance with embodiments of the present invention. In embodiments, the second signal processing system 324 may be used to transmit navigation system tracking information (which may operate at a different bandwidth from the transmission frequencies transmitted to the flight controller) to the navigation system 334, while attenuating the desired frequency ranges. In embodiments, the second signal processing system 324 may include a second antenna interface 326, a second bandpass filter 1700, a second notch filter 1704, a second varistor 1708, and a second radio transceiver interface 1712. In embodiments, the second signal processing system 324 may include a second antenna interface 326 operatively connected to a second antenna 328. In embodiments, the second antenna interface 326 may be configured to receive a fourth plurality of input radio frequency signals. In embodiments, the first antenna 316 may be further configured to transmit a second plurality of output radio frequency signals. In embodiments, the at least one second bandpass filter 1700 may be operatively connected to the second antenna interface 326. In embodiments, the at least one second bandpass filter 1700 may be configured to obtain the fourth plurality of input radio frequency signals from the second antenna interface 326. In embodiments, the at least one second bandpass filter 1700 may be configured to filter the fourth plurality of radio frequency signals to provide a fifth plurality of radio frequency signals. In embodiments, for example, the second bandpass filter 1700 filters out signals outside of the frequency band from 500 MHz to 3000 MHZ.

In embodiments, the at least one second notch filter 1704 may be operatively connected to the at least one second bandpass filter 1700. In embodiments, the at least one second notch filter 1704 may be configured to obtain the fifth plurality of input radio frequency signals from the at least one second bandpass filter 1700. In embodiments, the at least one second notch filter 1704 may be configured to then filter the fifth plurality of radio frequency signals to attenuate a second desired range of frequencies and provide a sixth plurality of radio frequency signals. In embodiments, for example, the second desired range of frequencies to be attenuated may be L-band signals (e.g., 1000 MHz to 2000 MHz). In embodiments, for example, the second desired range of frequencies to be attenuated may be S-band signals (e.g., 2000 MHz to 4000 MHz). In embodiments, for example, the second desired range of frequencies to be attenuated may be C-band signals (e.g., 4000 MHz to 8000 MHz). In embodiments, for example, the second desired range of frequencies to be attenuated may be X-band signals (e.g., 7000 MHz to 11200 MHZ). In embodiments, for example, the second desired range of frequencies to be attenuated may be ultrawide signals (e.g., greater than 500 MHZ). In embodiments, the fourth plurality of input radio frequency signals may be in a range that includes at least a navigation frequency range of a plurality of satellites that may be used to track the three-dimensional position of the unmanned aerial vehicle 700 and the second desired range of frequencies. In embodiments, for example, the navigation frequency range may include 1575.42 MHz. In embodiments, for example, the navigation frequency range may include 1227.6 MHz. In embodiments, the fifth plurality of input radio frequency signals may be a range that includes at least the navigation frequency range and the second desired range of frequencies. In embodiments, a high power microwave frequency weapon may operate in one of the above bandwidths which may be the desired range of frequency to be attenuated. In embodiments, the second desired range of frequencies may be the same as the first desired range of frequencies. In embodiments, the second desired range of frequencies may be different from the first desired range of frequencies.

In embodiments, the second varistor 1708 of the second signal processing system 324 may be operatively connected to the at least one second notch filter 1704. In embodiments, the second varistor 1708 may be configured to obtain the sixth plurality of input radio frequency signals from the at least one second notch filter 1704. In embodiments, the second varistor 1708 may be configured to then clamp a second voltage of the sixth plurality of input radio frequency signals based on a second selected clamping voltage. In embodiments, the second voltage may be the same as the first voltage. In embodiments, the second voltage may be different from the first voltage. In embodiments, the second selected clamping voltage may be the same as the first selected clamping voltage. In embodiments, the second selected clamping voltage may be the different from the first selected clamping voltage.

In embodiments, the second radio transceiver interface 1712 of the second signal processing system 324 may be operatively connected to the second varistor 1708. In embodiments, the second radio transceiver interface 1712 may be configured to receive the sixth plurality of input radio frequency signals.

In embodiments, referring back to FIG. 5A, the second radio transceiver 332 located in the first enclosure 300 may be operatively connected to the second radio transceiver interface 1712. In embodiments, the second radio transceiver 332 may be configured to receive the sixth plurality of input radio frequency signals. In embodiments, the sixth plurality of input radio frequency signals may include navigation information. In embodiments, the second radio transceiver 332 may be a GPS transceiver. In embodiments, the second radio transceiver 332 may be any type of location and navigation system transceiver, which may receive radio frequency signals received from satellites used for navigation and tracking.

In embodiments, the navigation system 334 located in the first enclosure 300 may be operatively connected to the second radio transceiver 332. In embodiments, the navigation system 334 may be, for example, a HEX Here3 Can GNSS GPS Module (SKU 14057). In embodiments, the navigation system 334 may be, for example, a UBLOX NEO-M8N HMC5983 GPS Module GYGPSV5-NEO. In embodiments, the navigation system 334 may be configured to receive the navigation information signals from the second radio transceiver 332. In embodiments, the navigation system 334 may be configured to generate three-dimensional position information associated with the unmanned aerial vehicle 700 in three-dimensional space based on the navigation information. In embodiments, the navigation system 334 may provide the three-dimensional position information associated with the unmanned aerial vehicle 700 to the flight controller 322. In embodiments, the navigation system 334 may include a second gyroscope 1310. In embodiments, the navigation system 334 may include an accelerometer 1312 configured to generate three-dimensional position information associated with the unmanned aerial vehicle 700. In embodiments, the navigation system 334 may include a second magnetometer 1314. In embodiments, the navigation system 334 may include a second processor 1322 and second memory 1320. In embodiments, the first radio transceiver 320 may be further configured to receive the three-dimensional position information from the navigation system 334 and transmit the three-dimensional positional information to the remote control 350. In embodiments, the three-dimensional position information may be used by the remote control 350 to track the unmanned aerial vehicle 700 while it moves through three-dimensional space. In embodiments, the navigation system 334 may provide the three-dimensional position information to the flight controller 322. In embodiments, the flight controller 322 may store the three-dimensional position information in the first memory 1316. In embodiments, the flight controller 322 may provide the three-dimensional position information to the first radio transceiver 320, which may then transmit the three-dimensional position information to the remote control 350 via the first antenna 316.

In embodiments, a voltage feedthrough connector 900 may be provided in the central body 702. In embodiments, the voltage feedthrough connector 900 may be operatively connected to the flight controller 322 and the navigation system 334 in the first enclosure 300. In embodiments, the voltage feedthrough connector 900 may be configured to provide power from a power distribution module 414 in a second enclosure 400 to the first enclosure 300 and the component provided therein. In embodiments, the voltage feedthrough connector 900 may be a fiber optic cable. In embodiments, the feedthrough connector may also provide control signals from the flight controller 322 to the second enclosure 400.

FIGS. 6 and 6A illustrate the internal components of the second chamber 400 of the unmanned aerial vehicle 700 in accordance with exemplary embodiments of the present invention. FIG. 6A is a schematic illustration of an unmanned aerial vehicle 700 in accordance with embodiments of the present invention, with a view of the interior of the second enclosure 400. Additionally, FIG. 6 is a schematic illustration of the second enclosure 400 of the unmanned aerial vehicle 700 in accordance with embodiments of the present invention. In embodiments, the second enclosure 400 may be operatively connected to the first enclosure 300. In embodiments, the second enclosure 400 may include a second top wall 402, a second bottom wall 404, and at least one second side wall 406 connecting the second top wall 402 and the second bottom wall 404 such that the second top wall 402, the second bottom wall 404, and the at least one second side wall 406 define a second chamber 408. In embodiments, the second chamber 408, for example, may be a three-dimensional polyhedron. In embodiments, the second chamber 408, for example, may be a cube. In embodiments, the second chamber 408, for example, may be a cylinder. In embodiments, the second enclosure 400 may further include a second electromagnetic interference gasket (not shown). In embodiments, a second continuous covering 410 of a second conductive material may be provided on a second outer surface of the second top wall 402, the second bottom wall 404, and the at least one second side wall 406 to inhibit electromagnetic fields. In embodiments, the second enclosure 400 may be a Faraday cage. In embodiments, the second conductive material may be aluminum. In embodiments, the aluminum may be coated in Class 2 Alodine in order to protect against the loss of electoral conductivity of the covering, as well as to prevent the second continuous covering 410 from corrosion. In embodiments, the second conductive material may be nickel. In embodiments, the second continuous covering 410 may be configured to maximize the attenuation of radio frequency signals. In embodiments, the second continuous covering 410 may be configured to attenuate electromagnetic signals, and thereby inhibit electromagnetic fields by at least 40 dB. In embodiments, the second continuous covering 410 may be configured to attenuate electromagnetic signals by over 65 dB.

In embodiments, the second enclosure 400 may be segregated from the first enclosure 300 in order to protect the integrity and operation of the plurality of low voltage components positioned in the first chamber 308. In embodiments, because each enclosure is configured to inhibit electromagnetic fields, the components may be segregated such that the plurality of high voltage components do not create electromagnetic interference with the plurality of low voltage components.

In embodiments, the second enclosure 400 may include a plurality of high voltage components positioned in the second chamber 408. In embodiments, the plurality of high voltage components may include a plurality of electronic speed controllers 412, a power distribution module 414, an input power interface 704, and a plurality of high power filters 710. In embodiments, the plurality of electronic speed controllers 412 may be operatively connected to the flight controller 322 via the voltage feedthrough connector 900. In embodiments, the plurality of electronic speed controllers 412 may be configured to obtain the plurality of control signals provided by the flight controller 322. In embodiments, the plurality of electronic speed controllers 412 may be configured to then generate a first plurality of motor speed signals based on the plurality of control signals provided by the flight controller 322.

Figure 13B:
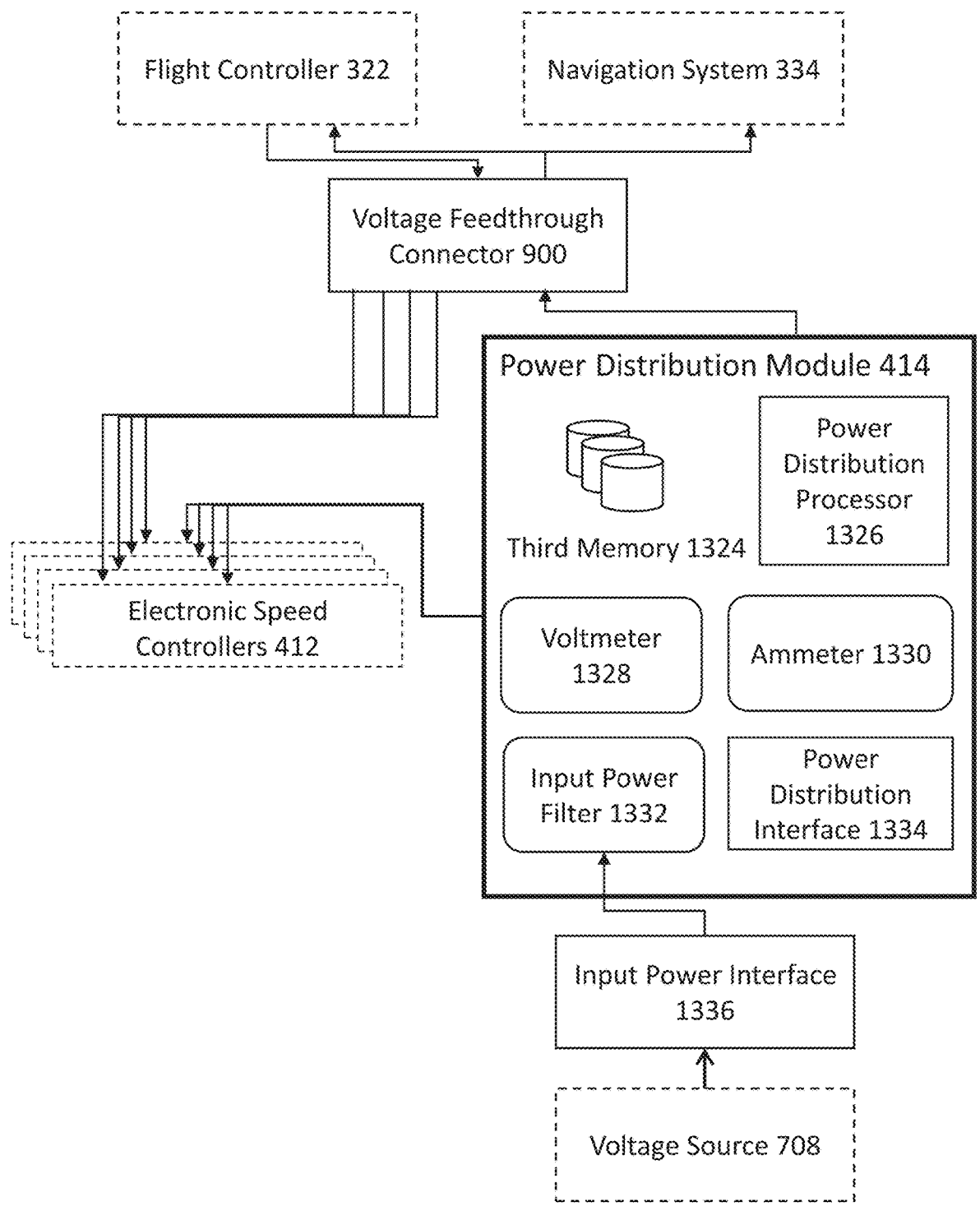

FIG. 13B is a schematic diagram of the components of the power distribution module 414 of the unmanned aerial vehicle 700 in accordance with embodiments of the present invention. In embodiments, the power distribution module 414 may be operatively connected to the flight controller 322 via the voltage feedthrough connector 900, and may be operatively connected to each electronic speed controller of the plurality of electronic speed controllers 412. In embodiments, the power distribution module 414 may be configured to distribute low power to the low power components if the first enclosure 300 via the voltage feedthrough connector 900, including a low voltage power input to the flight controller 322. In embodiments, the power distribution module 414 may be configured to distribute a high voltage input to the plurality of electronic speed controllers 412. In embodiments, the power distribution module 414 is further configured to determine the current drawn by each high power component of plurality of high power components, as well as measure the voltage across each high power component of the plurality of high power components. In embodiments, the power distribution module 414 may include a power distribution processor 1326, third memory 1324, and a plurality of power distribution interfaces 1334. In embodiments, the power distribution module 414 may be operatively connected to the plurality of high voltage and the plurality of low voltage components via the power distribution interfaces and connector 900. In embodiments, the power distribution module 414 may receive power input from a voltage source 708 (e.g., a battery) by the power distribution processor 1326. The power source may be a battery or multiple batteries. In embodiments, the battery or multiple batteries may be rechargeable batteries. In embodiments, the power distribution processor may determine the voltage input for each operatively connected component. In embodiments, the power distribution module 414 may include a voltage measurement device (e.g., a voltmeter 1328) and a current measurement device (e.g., an ammeter 1330). In embodiments, the power distribution processor 1326 may receive current and voltage measurements from each operatively connected component via the voltage measurement device and/or the current measurement device of the power distribution module 414. In embodiments, the third memory 1324 of the power distribution module 414 may store the measurements of the current drawn by each operatively connected component, and the voltage across each high power component.

In embodiments, referring back to FIG. 6 and FIG. 6A, each respective high power filter 710 of the plurality of high power filters may be operatively connected to a respective electronic speed controller of the plurality of electronic speed controllers 412. In embodiments, each high power filter 710 may be configured to obtain respective motor speed signals generated by the respective electronic speed controller. In embodiments, the respective high power filter 710 may be configured to then filter the respective motor speed signals to generate respective filtered motor speed signals. In embodiments, each respective high power filter 710 may be further configured to dissipate high power surges in order to protect the electrical components of the systems.

In embodiments, the unmanned aerial vehicle 700 may further include at least one electric motor 416 operatively connected to the central body 702. In embodiments, the at least one electric motor 416 may be, for example, a T-MOTOR U7 V2.0 (SKU Q00007). In embodiments, the at least one electric motor 416 may be electrically connected to at least one high power filter 710 of the plurality of high power filters. In embodiments, the at least on electric motor 416 may be operatively connected to at least one propeller 418 such that the at least one propeller 418 may be rotatable by the at least one electric motor 416. In embodiments, each respective at least one motor 416 may be configured to obtain the respective filtered motor speed signals from the at least one high power filter 710. In embodiments, each respective at least one motor 416 may be configured to, after obtaining the respective filtered motor speed signals from at least one high power filter 710, rotate the at least one propeller 418 based on the respective filtered motor speed signals. In embodiments, the at least one motor 416 may have at least one phase. In embodiments, each respective phase of a respective motor may be operatively connected to a respective high power filter 710 of the plurality of high power filters. For example, in embodiments, the at least one motor 416 may be three-phase motor, and each phase of the three-phase motor may be operatively connected to a respective high power filter 710. In embodiments, continuing this example, the three high power filters 710 may be operatively connected to one electronic speed controller of the plurality of electronic speed controllers 412. In embodiments, each propeller 418 may have two or more blades. In embodiments, each propeller 418 may have, for example, three blades. In embodiments, for example, the unmanned aerial vehicle 700 may include at least two electric motors 416 and each electric motor 416 may be connected to at least one respective propeller 418. In embodiments, for example, the unmanned aerial vehicle 700 may include at least at least four electric motors 416. In embodiments, for example, the unmanned aerial vehicle 700 may include at least at least six electric motors 416. In embodiments, for example, the unmanned aerial vehicle 700 may include at least at least eight electric motors 416. In embodiments, each electric motor 416 may be connected to at least two respective propellers.

In embodiments, the at least one motor 416 may be mounted to a respective mounting rod of a plurality of mounting rods 420. In embodiments, the unmanned aerial vehicle 700 may include at least one support rod 422, wherein each support rod 422 is connected to the frame 902 via a respective support rod interface of the plurality of support rod interfaces.

Referring to FIG. 6, in embodiments, the unmanned aerial vehicle 700 may include a barometric pressure feedthrough 620. In embodiments, the barometric pressure feedthrough 620 may be configured to pass air through the central body 702 of the unmanned aerial vehicle 700 and, into the first enclosure 300 via a first enclosure barometric pressure opening 622. Referring to FIG. 5, in embodiments, the barometric pressure feedthrough 620 may be configured to assist the first altimeter 1306 of the flight controller 322 in generating accurate pressure measurement information. Referring once again to FIG. 6, in embodiments, the barometric pressure feedthrough 620 may have a first length and a first diameter. In embodiments, the ratio of the first length to the first diameter may be at least 9 to 1, at least 10 to 1, or at least 12 to 1, to name a few. In embodiments, the ratio of the first length to the first diameter may be no greater than 20 to 1. In embodiments, the barometric pressure feedthrough 620 may be a conductive pipe. In embodiments, the barometric pressure feedthrough 620 may dissipate high power signal frequencies.

Figure 7:
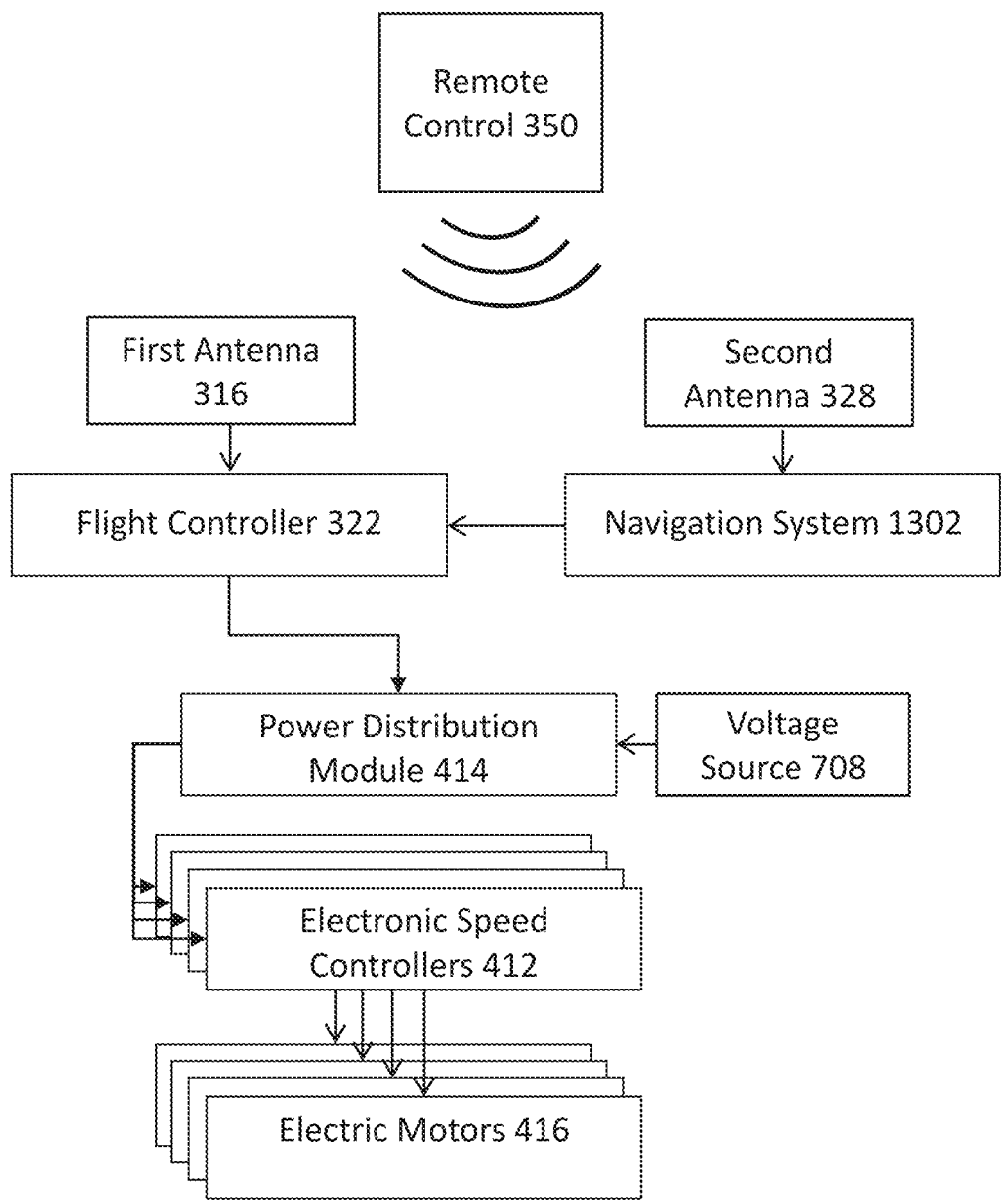
FIG. 7 is a schematic diagram of an unmanned aerial vehicle in accordance with embodiments of the present invention.
Figure 7A:
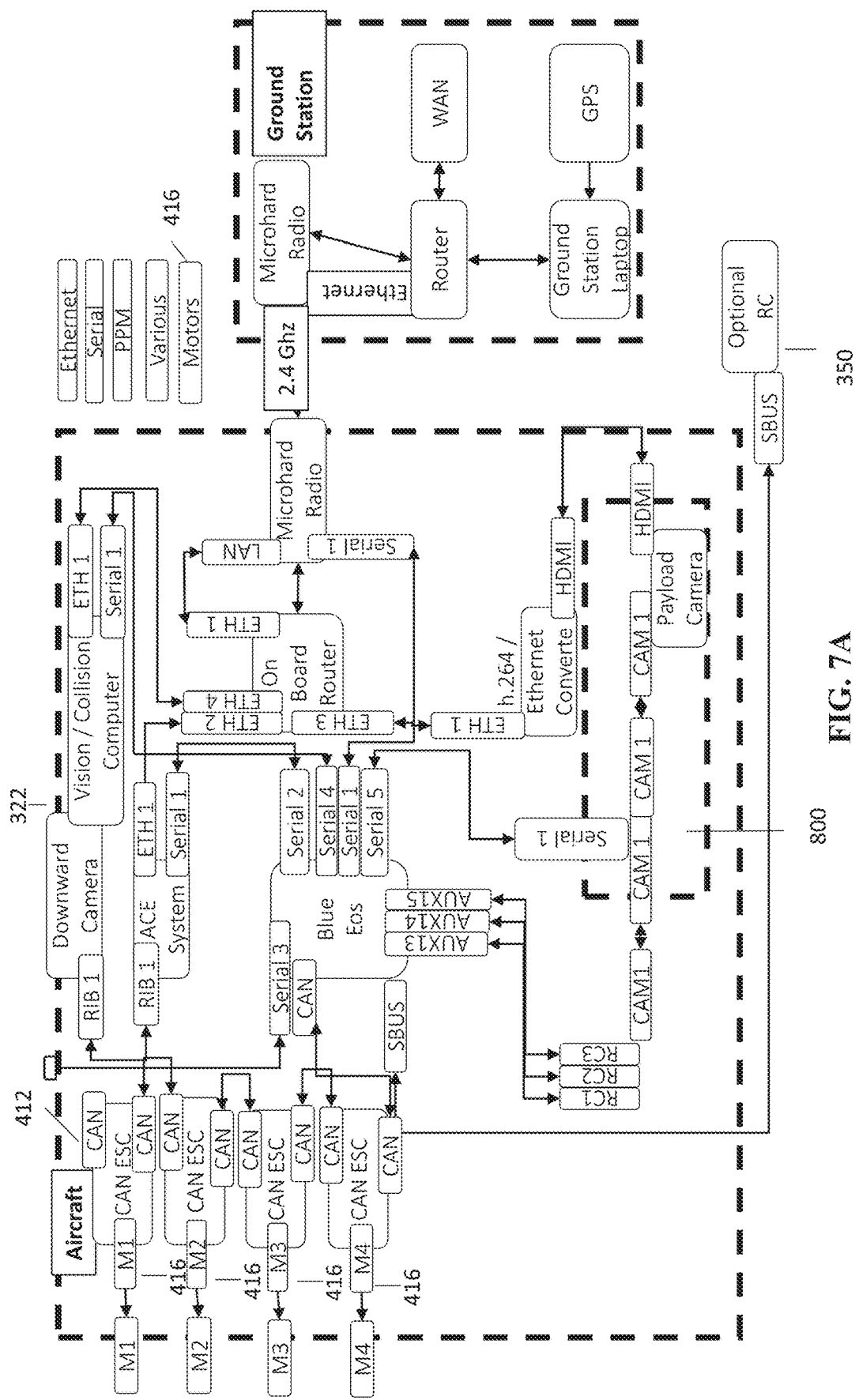
FIG. 7A is a schematic diagram of an unmanned aerial vehicle in accordance with embodiments of the present invention.

FIGS. 7 and 7A illustrate several of the internal components of the unmanned aerial vehicle 700 in accordance with exemplary embodiments of the present invention.

FIG. 7 is a schematic depicting connections between several different components of the unmanned aerial vehicle 700 in accordance with embodiments of the present invention. In embodiments, a first antenna 316 receives a plurality of radio frequency signals from a remote control 350, for example. In embodiments, the first antenna 316 provides the plurality of radio frequency signals to a flight controller 322. In embodiments, a second antenna 328 is operatively connected to a navigation system 1302 and provides a plurality of radio frequency signals to the navigation system. In embodiments, the navigation system 1302 is operatively connected to or integrated into the flight controller 322 and provides navigation information for use by the flight controller based on the plurality of radio frequency signals. In embodiments, a power distribution module 414 is operatively connected to a voltage source 708 and may be used to distribute power provided by the voltage source to the components of the unmanned aerial vehicle 700. In embodiments, the power distribution module 414 is operatively connected to the flight controller 322 and provides power thereto. In embodiments, the flight controller 322 determines a speed at which the at least one electric motor 416 should rotate based on control information received from the first antenna 316, or otherwise provided to or accessed by the flight controller and navigation information received via the second antenna 328, or otherwise provided, among others. In embodiments, the flight controller 322 sends control signals to a plurality of electronic speed controllers 412, which are also operably connected to the power distribution module 414. In embodiments, the speed controllers 412 provide power to the at least one electric motor 416 based on the control signals to control the rotational speed of the at least one electric motor 416. Referring now to FIG. 7A, which depicts exemplary operative connections between the components described by FIG. 7, in embodiments, the flight controller 322 may also be operatively connected to a payload 800 and may send or receive data therefrom.

FIGS. 10A-10B, 12A-12B, and 14A-14B illustrate exemplary flowcharts of a process flow for a process of operating an unmanned aerial vehicle 700 in accordance with embodiments of the present invention. In embodiments, referring to FIG. 10A, the process may begin with step S1002A. In embodiments, referring to FIG. 12A, the process may begin with step S1002B. In embodiments, steps S1002A and S1002B may be performed simultaneously. In embodiments, at step S1002A, a first antenna 316 outside a central body 702 of an unmanned aerial vehicle 700 may receive a first plurality of input radio frequency signals. At step S1002B, referring to FIG. 12A, in embodiments, a second antenna 328 outside the central body 702 may receive a fourth plurality of input radio frequency signals. FIG. 9 is a schematic diagram of the components of the unmanned aerial vehicle 700 in accordance with embodiments of the present invention. In embodiments, the central body 702 of an unmanned aerial vehicle 700 in accordance with the present disclosure may be segregated into a plurality of chambers or separate enclosures, each of which is coated with a continuous covering of conductive material on the respective outer surface thereof to inhibit electromagnetic fields from interfering with electronic components in the separate enclosures used to navigate and control the unmanned aerial vehicle. In embodiments, the first and second separate enclosures, 300 and 400, may form a first chamber 308 and a second chamber 408, respectively.

Figure 10A:
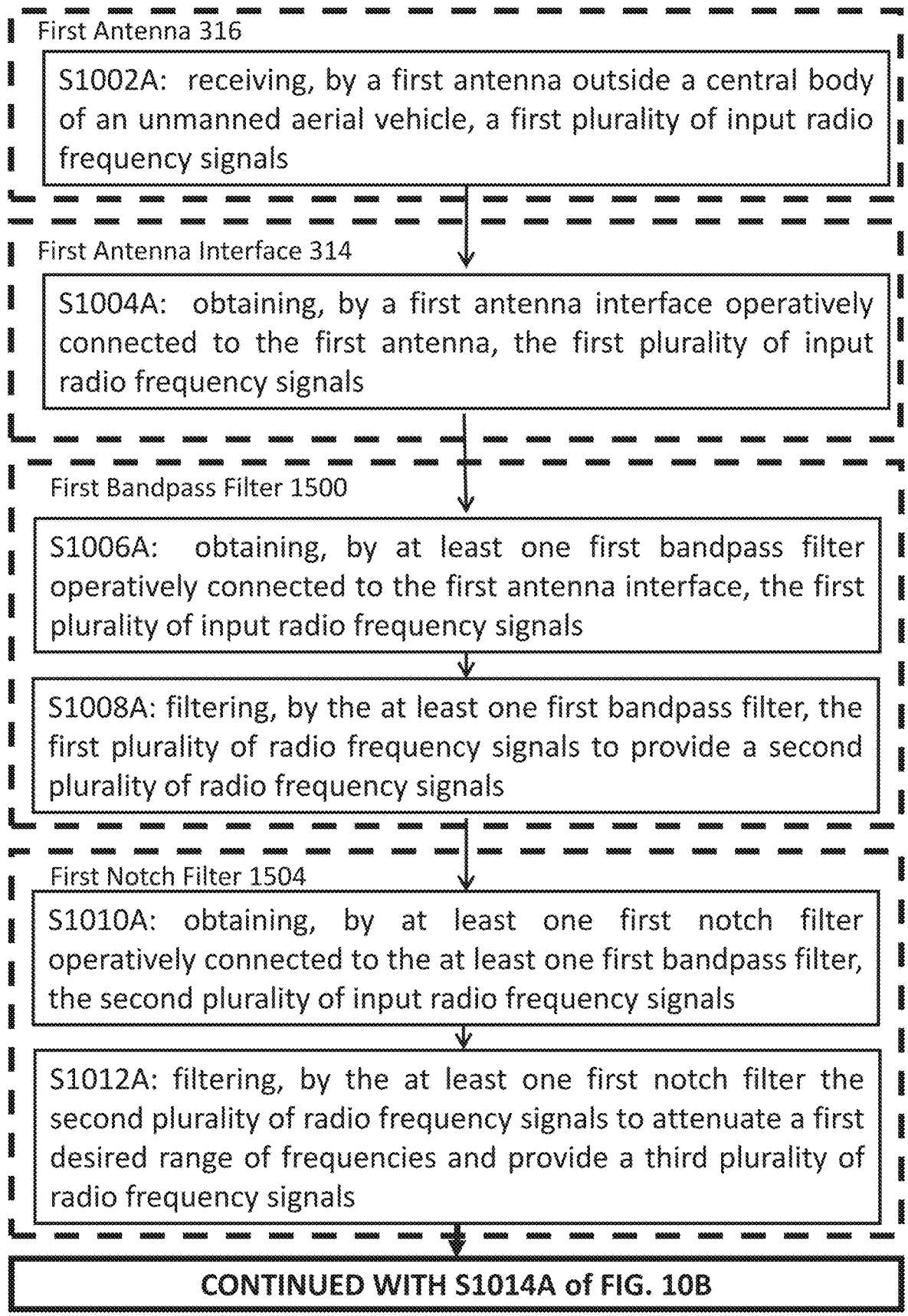

In embodiments, referring to FIG. 10A, the process may continue with step S1004A. In embodiments, referring to FIG. 12A, the process may instead continue with step S1004B. In embodiments, steps S1004A and S1004B may be performed simultaneously. At step S1004A, a first antenna interface 314 operatively connected to the first antenna 316 may obtain the first plurality of input radio frequency signals. In embodiments, the first antenna interface 314 may be a component of a first signal processing system 312, which may be positioned in the first chamber 308 of the first enclosure 300. In embodiments, referring to FIG. 10, the first signal processing system 312 may include the first antenna interface 314, at least one first bandpass filter 1500, at least one first notch filter 1504, a first varistor 1508, and a first radio transceiver interface 1512. At step S1004B, referring to FIG. 12A, a second antenna interface 326 operatively connected to the second antenna 328 may obtain the fourth plurality of input radio frequency signals. In embodiments, the second antenna interface 326 may be a component of a second signal processing system 324, which may be positioned in the second chamber 408 of the second enclosure 400. In embodiments, referring to FIG. 11, the second signal processing system 324 may include the second antenna interface 326, at least one second bandpass filter 1700, at least one second notch filter 1704, a second varistor 1708, and a second radio transceiver interface 1712.

In embodiments, referring to FIG. 10A, the process may continue with step S1006A. In embodiments, referring to FIG. 12A, the process may instead continue with step S1006B. In embodiments, steps S1006A and S1006B may be performed simultaneously. At step S1006A, the at least one first bandpass filter 1500, which may be operatively connected to the first antenna interface 314, may obtain the first plurality of input radio frequency signals. In embodiments, referring to FIG. 12A, at step S1006B, the at least one second bandpass filter 1700, which may be operatively connected to the second antenna interface 326, may obtain the fourth plurality of input radio frequency signals.

In embodiments, referring to FIG. 10A, the process may continue with step S1008A. In embodiments, referring to FIG. 12A, the process may instead continue with step S1008B. In embodiments, steps S1008A and S1008B may be performed simultaneously. At step S1008A, the at least one first bandpass filter 1500 may filter the first plurality of input radio frequency signals to provide a second plurality of input radio frequency signals. At step S1008B, referring to FIG. 12A, the at least one second bandpass filter 1700 may filter the fourth plurality of input radio frequency signals to provide a fifth plurality of input radio frequency signals. In embodiments, the at least one first bandpass filter 1500 provides the second plurality of input radio frequency signals based on attenuation of radio frequency signals having a frequency outside of a first predetermined frequency band from among the first plurality of input radio frequency signals. In embodiments, the at least one second bandpass filter 1700 provides the fifth plurality of input radio frequency signals based on attenuation of radio frequency signals having a frequency outside of a second predetermined frequency band from among the fourth plurality of input radio frequency signals.

In embodiments, referring to FIG. 10A, the process may continue with step S1010A. In embodiments, referring to FIG. 12A, the process may instead continue with step S1010B. In embodiments, steps S1010A and S1010B may be performed simultaneously. At step S1010A, in embodiments, the at least one first notch filter 1504, which may be operatively connected to the at least one first bandpass filter 1500, may obtain the second plurality of input radio frequency signals. At step S1010B, referring to FIG. 12A, the at least one second notch filter 1704, which may be operatively connected to the at least one second bandpass filter 1700, may obtain the fifth plurality of input radio frequency signals.

In embodiments, referring to FIG. 10A, the process may continue with step S1012A. In embodiments, referring to FIG. 12A, the process may instead continue with step S1012B. In embodiments, steps S1012A and S1012B may be performed simultaneously. At step S1012A, in embodiments, the at least one first notch filter 1504 may filter the second plurality of input radio frequency signals to attenuate a first desired range of frequencies and provide a third plurality of input radio frequency signals. At step S1012B, referring to FIG. 12A, in embodiments, the at least one second notch filter 1704 may filter the fifth plurality of input radio frequency signals to attenuate a second desired range of frequencies and provide a sixth plurality of input radio frequency signals.

In embodiments, referring to FIG. 10B, the process may continue with step S1014A. In embodiments, referring to FIG. 12B, the process may instead continue with step S1014B. In embodiments, steps S1014A and S1014B may be performed simultaneously. At step S1014A, in embodiments, the first varistor 1508, which may be operatively connected to the at least one first notch filter 1504, may obtain the third plurality of input radio frequency signals. At step S1014B, referring to FIG. 12B, in embodiments, the second varistor 1708, which may be operatively connected to the at least one second notch filter 1704, may obtain the sixth plurality of input radio frequency signals.

In embodiments, referring to FIG. 10B, the process may continue with step S1016A. In embodiments, referring to FIG. 12B, the process may instead continue with step S1016B. In embodiments, steps S1016A and S1016B may be performed simultaneously. At step S1016A, in embodiments, the first varistor 1508 may clamp a first voltage of the third plurality of input radio frequency signals based on a first selected clamping voltage. At step S1016B, referring to FIG. 12B, in embodiments, the second varistor 1708 may clamp a second voltage of the sixth plurality of input radio frequency signals based on a second selected clamping voltage. In embodiments, the first and second selected clamping voltage may be based on characteristics of the components of the unmanned aerial vehicle 700 to prevent damage thereto.

In embodiments, referring to FIG. 10B, the process may continue with step S1018A. In embodiments, referring to FIG. 12B, the process may instead continue with step S1018B. In embodiments, steps S1016A and S1016B may be performed simultaneously. At step S1018A, in embodiments, the first radio transceiver interface 1512, which may be operatively connected to the first varistor 1508, may receive the clamped third plurality of input radio frequency signals. In embodiments, the third plurality of input radio frequency signals may include control information transmitted by a remote control system 350. At step 1018B, in embodiments, the second radio transceiver interface 1712, which may be operatively connected to the second varistor 1708, may receive the clamped sixth plurality of input radio frequency signals. In embodiments, the sixth plurality of input radio frequency signals may include navigation information.

Referring now to FIG. 14A, in embodiments, the process may continue from step S1018A with step S1020. In embodiments, in step S1020, the first radio transceiver 320, which may be operatively connected to the first radio transceiver interface 1512, may obtain the third plurality of input radio frequency signals. In embodiments, the process may continue with step S1022. In embodiments, in step S1022, the second radio transceiver 332, which may be operatively connected to the second radio transceiver interface 1712, may obtain the sixth plurality of input radio frequency signals. In embodiments, step S1022 may occur after step S1020. In embodiments, step S1020 and step S1022 may occur simultaneously.

Still referring to FIG. 14A, in embodiments, the process may continue with step S1024. In embodiments, in step S1024, a first processor 1318, which in embodiments may be a component of the flight controller 322, which in turn may be operatively connected to the first radio transceiver 320, may obtain the clamped third plurality of input radio frequency signals including control information included therein. In embodiments, step S1024 and step S1020 may occur simultaneously. In embodiments, the process may continue at step S1026 from step S1024. In embodiments, in step S1026, a second processor 1322 of the navigation system 334, which may be operatively connected to the second radio transceiver 1322, which in turn may be operatively connected to the second radio transceiver 332, may obtain the clamped sixth plurality of input radio frequency signals including the control information included therein. In embodiments, step S1026 may occur before step S1024. In embodiments, step S1026 may occur after step S1024. In embodiments, step S1026 may occur simultaneously with step S1024. FIG. 13A is a schematic diagram of the components of the flight controller 322 and the navigation system 334 of the unmanned aerial vehicle 700 in accordance with embodiments of the present invention.

Still referring to FIG. 14A, in embodiments, the process may continue with step S1028. In embodiments, in step S1028, the second processor 1322 may generate three-dimensional position information associated with the unmanned aerial vehicle 700 based at least on the navigation information included in the clamped sixth plurality of input radio frequency signals. In embodiments, step S1028 may occur before step S1020 and step S1024. In embodiments, step S1028 may occur simultaneously with step S1020 and step S1024. In embodiments, the process may continue at step S1030. In embodiments, in step S1030, the first processor 1318 of the flight controller 322 may obtain the three-dimensional position information from the second processor 1322 of the navigation system 334. In embodiments, step S1030 may occur before step S1020 and step S1024. In embodiments, the process may then continue with step S1032. In embodiments, in step S1032, the first processor 1318 may generate a plurality of control signals to direct movement of the unmanned aerial vehicle 700 based at least on the control information included in the clamped third plurality of input radio frequency signals and the three-dimensional position information.

Referring now to FIG. 14B, in embodiments, the process may continue at step S1034. In embodiments, in step S1034, the plurality of electronic speed controllers 412 may obtain, via a voltage feedthrough connector 900, which may be operatively connected to the flight controller 322, the plurality of control signals generated in step S1032. In embodiments, step S1034 may occur continuously. In embodiments, step S1034 may occur at given intervals. In embodiments, the process may then continue at step S1036. In step S1036, the plurality of electronic speed controllers 412 may generate a first plurality of motor speed signals based on the plurality of control signals provided by the flight controller 322.

Still referring to FIG. 14B, in embodiments, the process may continue at step S1038. In embodiments, in step S1038, the plurality of high power filters 710, which may each be operatively connected to a respective electronic speed controller of the plurality of electronic speed controllers 412, may obtain the respective motor speed signals generated by the respective electronic speed controller. In embodiments, step S1038 may occur continuously. In embodiments, step S1038 may occur at given intervals. In embodiments, the process may continue at step S1040. In embodiments, in step S1040, the plurality of high power filters 710 may filter the respective motor speed signals to generate respective filtered motor speed signals. In embodiments, step S1040 may occur simultaneously with step S1038. In embodiments, step S1040 may occur after step S1038.

Still referring to FIG. 14B, in embodiments, the process may continue at step S1042. In embodiments, in step S1042, the at least one electric motor 416, which may be electrically connected to at least one high power filter of the plurality of high power filters 710, may obtain the respective filtered motored speed signals. In embodiments, step S1042 may occur continuously. In embodiments, step S1042 may occur at given intervals. In embodiments, the process may then continue at step S1044. In embodiments, in step S1044, the at least one electric motor 416 may rotate the at least one propeller 418, which may be operatively connected to the at least one electric motor 416, based on the respective filtered motor speed signals. In embodiments, step S1044 may occur simultaneously with step S1042. In embodiments, step S1044 may occur after step S1042.

Now that embodiments of the present invention have been shown and described in detail, various modifications and improvements thereon can become readily apparent to those skilled in the art. Accordingly, the exemplary embodiments of the present invention, as set forth above, are intended to be illustrative, not limiting. The spirit and scope of the present invention is to be construed broadly.

What is claimed is:

1. An unmanned aerial vehicle comprising:
   (a) a central body comprising:
      (i) a first enclosure comprising:
         (a) a first chamber defined by a first outer surface and a first inner surface;
         (b) a first continuous covering of a first conductive material on the first outer surface to inhibit electromagnetic fields;
         (c) a plurality of low voltage components positioned in the first chamber, wherein the plurality of low voltage components comprises:
            (i) a first signal processing system;
            (ii) a first radio transceiver operatively connected to the first signal processing system;
            (iii) a flight controller operatively connected to the first radio transceiver;
            (iv) a second signal processing system;
            (v) a second radio transceiver operatively connected to the second signal processing system;
      (ii) a navigation system operatively connected to the second radio transceiver;
      (iii) a voltage feedthrough connector operatively connected to the flight controller, the navigation system in the first enclosure, and a power distribution module in a second enclosure;
      (iv) the second enclosure operatively connected to the first enclosure, the second enclosure comprising:
         (a) a second chamber defined by a second outer surface and a second inner surface;
         (b) a second continuous covering of a second conductive material on the second outer surface thereof to inhibit electromagnetic fields;
         (c) a plurality of high voltage components positioned in the second chamber, and wherein the plurality of high voltage components comprises:
            (i) a plurality of electronic speed controllers operatively connected to the flight controller via the voltage feedthrough connector;
            (ii) the power distribution module operatively connected to the flight controller via a voltage feedthrough connector and operatively connected to each electronic speed controller of the plurality of electronic speed controllers;
            (iii) an input power interface operatively connected to a voltage source outside the central body via an input power filter;
            (iv) a plurality of high power filters, wherein each respective high power filter is operatively connected to a respective electronic speed controller of the plurality of electronic speed controllers;
   (b) a first antenna operatively connected to the first signal processing system;
   (c) a second antenna operatively connected to the second signal processing system;
   (d) the voltage source operatively connected to the input power interface;
   (e) at least one electric motor operatively connected to the central body and electrically connected to at least one high power filter of the plurality of high power filters, the at least one electric motor operatively connected to at least one propeller such that the at least one propeller is rotatable by the at least one electric motor; and (f) a barometric pressure feedthrough having a first length and a first diameter and configured to pass air through the central body of the unmanned aerial vehicle.

2. The unmanned aerial vehicle of claim 1, wherein the first enclosure further comprises a first electromagnetic interference gasket.

3. The unmanned aerial vehicle of claim 1, wherein the first conductive material is one of aluminum with a class 2 Alodine coating and nickel.

4. The unmanned aerial vehicle of claim 1, wherein the first enclosure inhibits electromagnetic fields by at least 40 decibels.

5. The unmanned aerial vehicle of claim 1, wherein the flight controller comprises a first processor and first memory.

6. The unmanned aerial vehicle of claim 1, wherein the flight controller comprises at least one of a gyroscope, an altimeter, a barometer, and a magnetometer.

7. The unmanned aerial vehicle of claim 1, wherein the navigation system comprises at least one of a gyroscope, an accelerometer, and a magnetometer.

8. The unmanned aerial vehicle of claim 1, wherein the second enclosure further comprises a second electromagnetic interference gasket.

9. The unmanned aerial vehicle of claim 1, wherein the second conductive material comprises at least one of aluminum with a class 2 Alodine coating and nickel.

10. The unmanned aerial vehicle of claim 1, wherein the second enclosure inhibits electromagnetic fields by at least 40 decibels.

11. The unmanned aerial vehicle of claim 1, wherein the voltage source comprises one or more batteries.

12. The unmanned aerial vehicle of claim 1, wherein the at least one electric motor has at least one phase, and wherein each respective phase is operatively connected to a respective high power filter of the plurality of high power filters.

13. The unmanned aerial vehicle of claim 1, wherein the at least one electric motor is mounted to a respective mounting rod of a plurality of mounting rods.

14. The unmanned aerial vehicle of claim 1, wherein the at least one electric motor is a three-phase motor.

15. The unmanned aerial vehicle of claim 1, wherein the unmanned aerial vehicle comprises at least 2 motors and each motor is connected to at least one respective propeller.

16. The unmanned aerial vehicle of claim 1, wherein a ratio of the first length to the first diameter is at least 9 to 1.

17. The unmanned aerial vehicle of claim 1, wherein the barometric pressure feedthrough is a conductive pipe.

18. The unmanned aerial vehicle of claim 1, wherein the unmanned aerial vehicle further comprises a payload.

19. The unmanned aerial vehicle of claim 18, wherein the payload comprises an electromagnetic field measurement chamber.

* * * * *